(12) United States Patent
Seo

(10) Patent No.: US 11,251,224 B2
(45) Date of Patent: Feb. 15, 2022

(54) DISPLAY DEVICE AND METHOD OF FABRICATING THE SAME

(71) Applicant: SAMSUNG DISPLAY CO., LTD., Yongin-si (KR)

(72) Inventor: Woosuk Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/553,468

(22) Filed: Aug. 28, 2019

(65) Prior Publication Data
US 2020/0135800 A1 Apr. 30, 2020

(30) Foreign Application Priority Data

Oct. 31, 2018 (KR) .................. 10-2018-0132271
Mar. 7, 2019 (KR) .................. 10-2019-0026125

(51) Int. Cl.
| | |
|---|---|
| *H01L 27/15* | (2006.01) |
| *H01L 27/32* | (2006.01) |
| *H01L 51/56* | (2006.01) |
| *H01L 33/56* | (2010.01) |
| *H01L 33/62* | (2010.01) |

(Continued)

(52) U.S. Cl.
CPC .......... *H01L 27/156* (2013.01); *H01L 27/323* (2013.01); *H01L 27/3227* (2013.01); *H01L 27/3276* (2013.01); *H01L 33/0095* (2013.01); *H01L 33/56* (2013.01); *H01L 33/62* (2013.01); *H01L 51/5246* (2013.01); *H01L 51/56* (2013.01); *H01L 2227/323* (2013.01)

(58) Field of Classification Search
CPC ............. H01L 27/3276; H01L 27/3227; H01L 27/156; H01L 27/323; H01L 33/0095; H01L 33/62; H01L 51/5246; H01L 51/56; H01L 51/524; H01L 33/56
See application file for complete search history.

(56) References Cited

U.S. PATENT DOCUMENTS

2007/0164672 A1* 7/2007 Omura ................ H01L 51/5246
                                                             313/512
2012/0069241 A1* 3/2012 Shiau .................... G06F 1/1605
                                                             348/373

(Continued)

FOREIGN PATENT DOCUMENTS

| KR | 10-1800669 | 12/2017 |
|---|---|---|
| KR | 10-2018-0062497 | 6/2018 |
| KR | 10-2019-0120464 | 10/2019 |

*Primary Examiner* — Vongsavanh Sengdara
(74) *Attorney, Agent, or Firm* — F. Chau & Associates, LLC

(57) ABSTRACT

A method of fabricating a display device includes providing a display substrate with a plurality of pixels, mounting an encapsulation substrate on the display substrate, bonding the display substrate and the encapsulation substrate to form a display panel, and forming a module hole penetrating a hole region of the display panel in the display panel. The hole region encloses the module hole, and the display substrate and the encapsulation substrate may be bonded by irradiating the hole region with an ultra-high-frequency pulsed laser. The display substrate and the encapsulation substrate are bonded in the hole region as the ultra-high-frequency pulsed laser is irradiated onto the hole region.

13 Claims, 18 Drawing Sheets

(51) Int. Cl.
*H01L 33/00* (2010.01)
*H01L 51/52* (2006.01)

(56) References Cited

U.S. PATENT DOCUMENTS

2012/0270460 A1* 10/2012 Miyazawa .......... H01L 27/3241
  445/2
2017/0294543 A1* 10/2017 Yamazaki ........... H01L 27/1229
2018/0149807 A1   5/2018 Seo et al.

* cited by examiner

DISPLAY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2018-0132271, filed on Oct. 31, 2018, and Korean Patent Application No. 10-2019-0026125, filed on Mar. 7, 2019, in the Korean Intellectual Property Office, the entire contents of which are hereby incorporated by reference.

BACKGROUND OF THE INVENTION

1. Field

One or more embodiments disclosed herein relate to a display device and method of fabricating a display device.

2. Description of Related Art

A variety of displays have been developed for use in smartphones, tablets, computers, and other electronic devices. As displays continue to evolve, it is a continued goal of system designs to decrease power consumption and provide excellent portability with high added value. Many devices on the market today fail to meet these design objectives.

SUMMARY

Embodiments of the inventive concept provide a display device with improved durability and aesthetic appearance, and a method of fabricating a display device of this type using a simplified process and with reduced fabrication costs.

In accordance with one or more embodiments, a method of fabricating a display device includes providing a display substrate with a plurality of pixels; mounting an encapsulation substrate on the display substrate; bonding the display substrate and the encapsulation substrate to form a display panel; and forming a module hole penetrating a hole region of the display panel in the display panel, wherein the hole region encloses the module hole and wherein bonding the display substrate and the encapsulation substrate includes irradiating the hole region with an ultra-high-frequency pulsed laser, the display substrate and the encapsulation substrate being bonded in the hole region as the ultra-high-frequency pulsed laser is irradiated onto the hole region.

The ultra-high-frequency pulsed laser may be a femtosecond laser. The hole region may include a margin region enclosing the module hole; a hole-sealing region enclosing the margin region; and a wiring region enclosing the hole-sealing region and including a plurality of signal lines, wherein bonding the display substrate and the encapsulation substrate includes placing a focal point of the ultra-high-frequency pulsed laser in at least one of the margin region and the hole-sealing region.

The method may include disposing a hole-sealing member on the hole-sealing region of the encapsulation substrate before mounting the encapsulation substrate on the display substrate. The hole-sealing member may include a glass material. Irradiating the hole region with the ultra-high-frequency pulsed laser may include continuously moving a focal point of the ultra-high-frequency pulsed laser in an interface region between the display substrate and the encapsulation substrate.

Bonding the display substrate and the encapsulation substrate may include irradiating a laser onto a substrate-sealing region located at an edge region of each of the display substrate and the encapsulation substrate and between the display substrate and the encapsulation substrate. The laser irradiated onto the substrate-sealing region may be a femtosecond laser.

The method may include disposing a substrate-sealing member on the substrate-sealing region of the encapsulation substrate before mounting the encapsulation substrate on the display substrate. A width of a hole sealing region formed in the hole region may be less than or equal to about 100 µm, and the display substrate and the encapsulation substrate are bonded in the hole sealing region. When the ultra-high-frequency pulsed laser is irradiated onto the hole region, the display substrate and the encapsulation substrate may be melted and mixed in a boundary between the display substrate and the encapsulation substrate to form a bonding region. The method may include disposing an electronic module below the display panel to correspond to the module hole. The electronic module may include at least one of a camera, a speaker, a light sensing sensor, and a heat sensing sensor.

In accordance with one or more embodiments, a display device includes a display panel including a hole region, a display region enclosing the hole region, and a non-display region enclosing the display region, the hole region enclosing a module hole of the display panel; and an electronic module overlapped with the module hole, wherein the display panel includes: a display substrate including a plurality of pixels; and an encapsulation substrate on the display substrate to cover the plurality or pixels, the encapsulation substrate being bonded to the display substrate in a hole-sealing region which corresponds to a portion of the hole region, wherein a width of the hole-sealing region is less than about 100 µm.

The display device may include a hole-sealing member between the display substrate and the encapsulation substrate in the hole sealing region. The hole-sealing member may include a glass material. A thickness of the hole-sealing member may range from about 4.5 µm to about 5.5 µm. A bonding strength between the display substrate and the encapsulation substrate in the hole-sealing region may be greater than or equal to about 5 kgf.

The hole region may include a wiring region enclosing the hole-sealing region and including a plurality of signal lines, and the display substrate and the encapsulation substrate are spaced apart from each other by a predetermined distance in the wiring region. The electronic module may include at least one of a camera, a speaker, a light sensing sensor, and a heat sensing sensor. The non-display region may include a substrate-sealing region, and the display substrate and the encapsulation substrate may be bonded in the substrate-sealing region. The display device may include a substrate-sealing member between the display substrate and the encapsulation substrate in the substrate-sealing region.

In accordance with one or more embodiments, a method of fabricating a display device includes providing a display substrate which includes a plurality of pixels; mounting an encapsulation substrate on the display substrate; bonding the display substrate and the encapsulation substrate to form a display panel; and forming a module hole in the display panel, wherein the display panel includes a hole region enclosing the module hole, a display region enclosing the hole region, and a non-display region enclosing the display region and wherein: bonding of the display substrate and the encapsulation substrate includes irradiating a femtosecond laser between the display substrate and the encapsulation substrate in the hole region, the display substrate and the encapsulation substrate being melted and mixed in a boundary between the display substrate and the encapsulation substrate to form a bonding region, as the femtosecond laser is irradiated.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
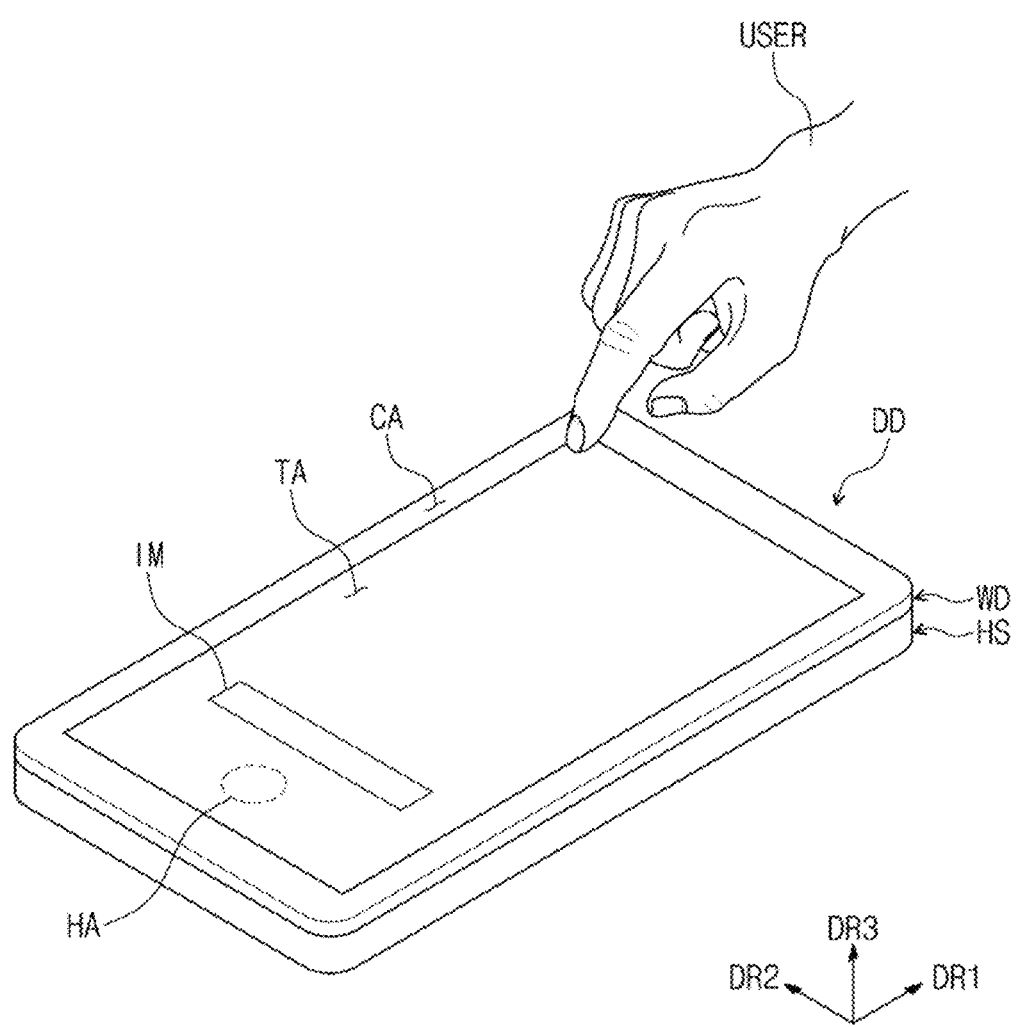
FIG. 1 illustrates an embodiment of a display device.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the drawings may indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of relevant art and will not be interpreted in an idealized or overly formal sense unless expressly so defined herein.

Figure 2:
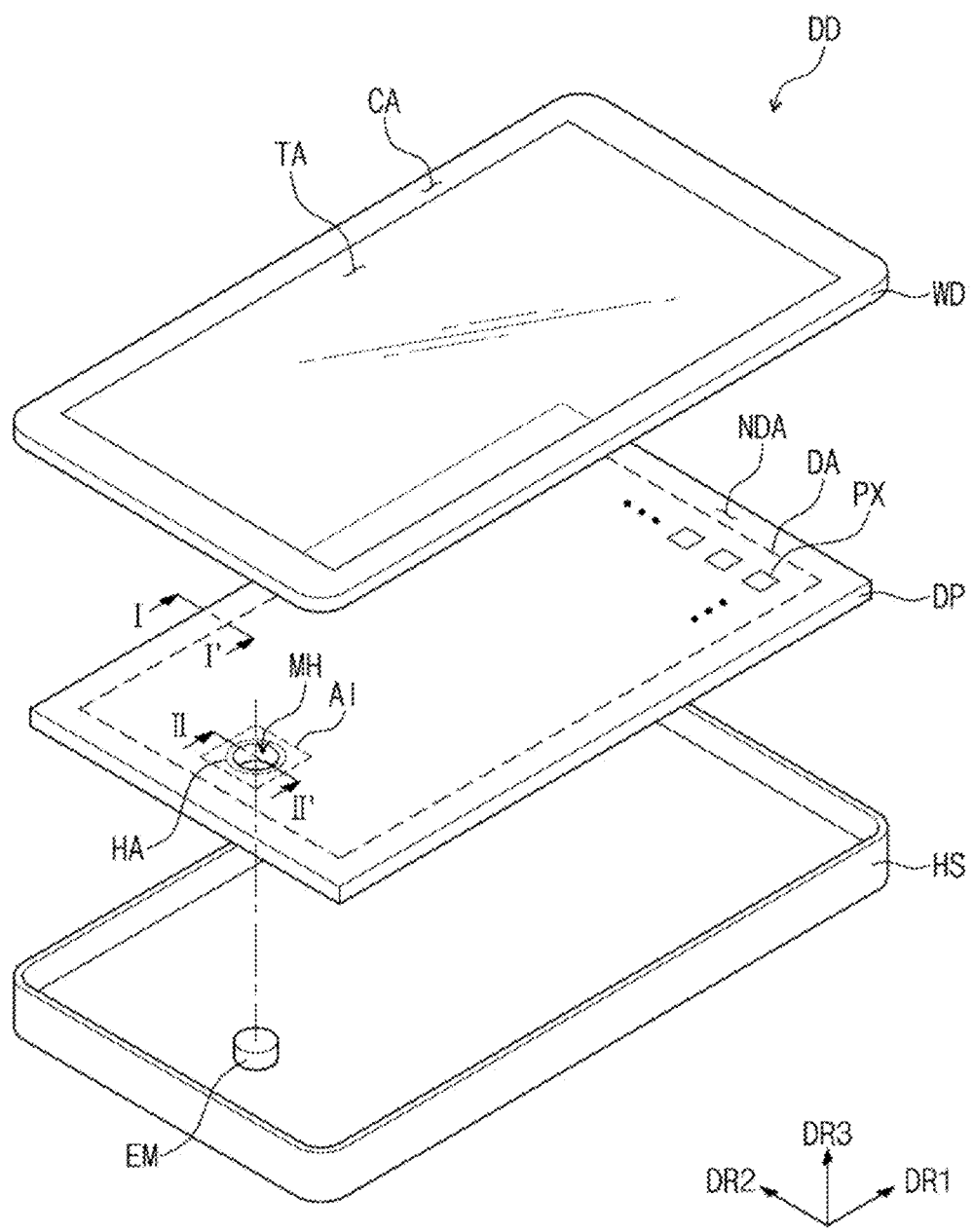
FIG. 2 illustrates an exploded view of the display device of FIG. 1.
Figure 3:
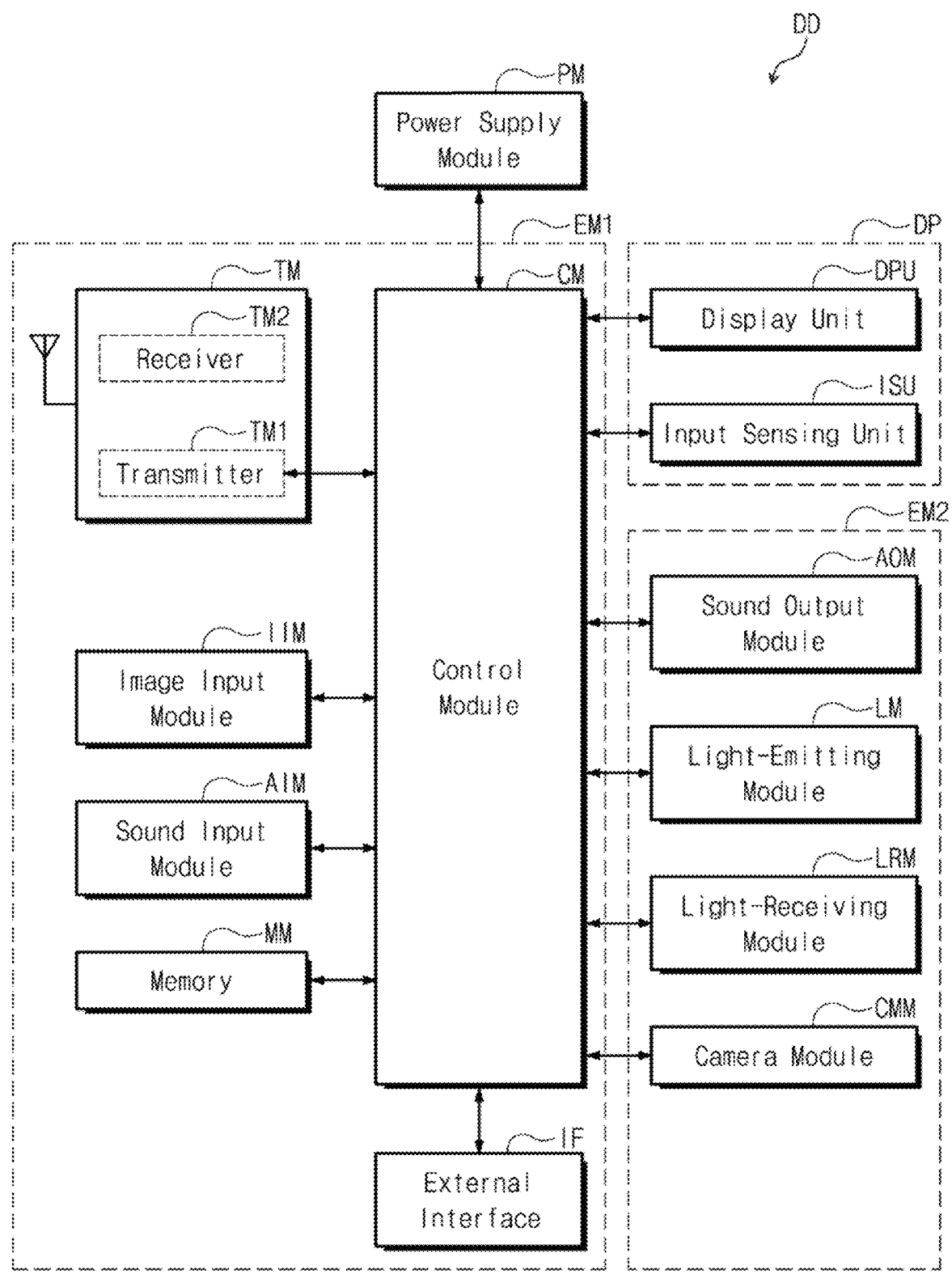
FIG. 3 illustrates a functional block diagram of the display device of FIG. 1.

FIG. 1 illustrates an embodiment of a display device DD, FIG. 2 illustrates an exploded perspective view of display device DD according to an embodiment, and FIG. 3 illustrates a functional block diagram of display device DD according to an embodiment. According to the embodiments of FIGS. 1, 2 and 3, the display device DD may be selectively activated based on an applied electrical signal. The display device DD may be included, for example, in a smart phone, tablet, notebook, computer, media player, navigation device, Internet of Things (IoT) devices, monitors, and smart television, as well as other electronic devices that display information. For illustrative purposes, the following description considers the case where the display device DD is implemented in a smart phone.

As illustrated in FIG. 1, the display device DD may include a front surface that displays an image IM. The front surface may be parallel to a plane defined by a first direction DR1 and a second direction DR2. In an exemplary embodiment, the display device DD may have a rectangular shape with long sides extending in the first direction DR1 and short sides extending in the second direction DR2 perpendicular to the first direction DR1. In another embodiment, the display device DD may have a different shape.

As illustrated in FIGS. 1 and 2, the display device DD may include a window member WD, a display panel DP, an electronic module EM, and a housing member HS. As illustrated in FIG. 3, the display device DD may further include a power supply module PM. Some of the elements in FIG. 3 may be omitted from figures described below. Hereinafter, the display device DD will be described in more detail with reference to FIGS. 1 to 3.

The window member WD may include a front surface which corresponds to the front surface of the display panel DP and which protects the display panel DP. The window member WD may include, for example, a glass substrate, a sapphire substrate, or a plastic film. The window member WD may have a single-layered structure or a multi-layered structure. In one embodiment, the window member WD may have a stacking structure including a plurality of plastic films coupled together by an adhesive layer or may have a stacking structure including a glass substrate and a plastic film coupled together by an adhesive layer.

The front surface of the window member WD may include a transmission region TA and a light-blocking region CA. The transmission region TA may transmit the image IM for viewing by a user USER. The image IM illustrated in FIG. 1 includes an internet search window as an example.

The light-blocking region CA may be adjacent to the transmission region TA and may be transparent or have a specific color. In one embodiment, the light-blocking region CA may enclose the transmission region TA. In another embodiment, the light-blocking region CA may only be adjacent to one (or fewer than all) of side regions of the transmission region TA, or may be omitted altogether.

A direction normal to the front surface of the display device DD may correspond to a thickness direction of the display device DD. For convenience of description, the normal direction of the front surface of the display device DD (e.g., a propagation direction of an image or light in the display device DD) may be referred to as an upward direction, and a direction opposite to the upward direction may be referred to as a downward direction. In one embodiment, the upward and downward directions may extend in a third direction DR3 that is orthogonal to the first and second directions DR1 and DR2. Hereinafter, front and rear surfaces of each of the elements described below will be differentiated based on the third direction DR3. However, the upward and downward directions may be relative concept and may indicate other directions in another embodiment.

The display panel DP may include a display unit DPU that displays the image IM. When viewed in a plan view, the display panel DP may include a display region DA, a non-display region NDA, and a hole region HA. The display region DA may display (e.g., emit light corresponding to) the image IM. The image may be displayed based on light emitted from a plurality of pixels PX in the display region DA. The non-display region NDA and the hole region HA may not emit light corresponding to the image IM. In one embodiment, the non-display region NDA may have a shape that encloses or is adjacent to the display region DA.

The display panel DP may have at least one module hole MH extending in the third direction DR3. In one embodiment, the module hole MH may be a through-hole which penetrates the display panel DP from a front surface to a rear surface thereof. If an element is disposed on the rear surface of the display panel DP and overlaps the module hole MH, such an element may be seen by a user through the front surface of the display panel DP, due to the presence of the module hole MH. In the present embodiment, the module hole MH has a cylindrical shape elongated in the third direction DR3. The module hole MH may have a different shape in another embodiment, e.g., polygonal, elliptical pillar shape, truncated pyramid, or cone shape.

The module hole MH may be overlapped with the electronic module EM, when viewed in a plan view. The electronic module EM may be inserted into the module hole MH. The electronic module EM may receive an external input through the module hole MH. The electronic module EM may receive an input signal through the module hole and then may provide the input signal to the display panel DP. Geometrical features of the electronic module EM may be designed to allow the electronic module EM to be accommodated in the module hole MH. For example, the electronic module EM may have a size equal to or smaller than that of the module hole MH.

The hole region HA may enclose the module hole MH. When viewed in a plan view, the hole region HA may be spaced apart from the non-display region NDA with the display region DA interposed therebetween. In one embodiment, the hole region HA may be enclosed by the display region DA. Embodiments of the hole region HA will be described in more detail with reference to FIGS. 4 and 7 to 9.

The display panel DP may further include an input sensing unit ISU that senses an external input signal. The external input signal may include various types of signals generated by an externally applied stimulus or effect. For example, the input signal may be generated based on an externally applied touch from a part of a user's body or external light, heat, or pressure, e.g., based on a input. In the present embodiment, the input signal be a touch signal.

The display panel DP may generate an input signal based on an input received by the display region DA, but may not generated an input signal based on an input received by the non-display region NDA. In an embodiment, the display panel DP may generate an input signal based on an input received by the non-display region NDA, but may not generate an input signal based on an input received by the display region DA. In an embodiment, the display panel DP may generate input signals based on inputs received by the front surface of the display panel DP including the display region DA and the non-display region NDA. In an embodiment, depending on the internal configuration of the display panel DP, the display panel. DP may generate an input signal based on an input received by various regions, but the inventive concept is not limited to a specific embodiment.

For illustrative purposes, FIG. 1 illustrates an example of an input signal produced by a part (e.g., hand or finger) of a user's body. However, the inventive concept is not limited to this example, and in an exemplary embodiment, the display device may sense various types of input signals. In an embodiment, the input sensing unit ISU may be provided as an element separated from the display panel DP and may be disposed on the display panel DP. In an embodiment, the input sensing unit ISU may be omitted. For convenience in illustration, the input sensing unit ISU is omitted from figures described below.

The housing member HS may, be disposed on the rear surface of the display panel DP. The housing member HS may be combined with the window member WD to define a rear surface of the display device DD. In one embodiment, the housing member HS may combined with the window member WD to include an internal space therebetween. This internal space may accommodate various components (e.g., the display panel DP, the electronic module EM, and/or electronic and optical components) of the display device DD. The housing member HS may be formed of or include a material having a relatively highly stiffness or strength. In one embodiment, the housing member HS may include a plurality of frames and/or plates, each of which is formed of at least one of glass, plastic, or metallic materials. The housing member HS may protect the components of the display device DD stored in the internal space from an external impact.

The display device DD may also include an anti-reflection member between the display panel DP and the window member WD. The anti-reflection member may prevent external light, incident on the display device DD, from being reflected by the display panel DP and recognized by a user. For example, the anti-reflection member may include a polarization layer and a phase retardation layer.

Referring to FIG. 3, the display device DD may include the power supply module PM, a first electronic module EM1, and a second electronic module EM2. The power supply module PM may supply electric power to the display device DD. In one embodiment, the power supply module PM may include a battery module.

The first electronic module EM1 and the second electronic module EM2 may include one or more functional modules to be used in operating the display device DD. The first electronic module EM1 may be directly mounted on a printed or flexible circuit board electrically connected to the display panel DP.

The first electronic module EM1, may include a control module CM, a wireless communication module TM, an image input module IIM, a sound input module AIM, a memory MM, and an external interface IF. The control module CM may control overall operations of the display device DD. The control module CM may be, for example, a microprocessor. In an embodiment, the display panel DP may be activated or deactivated under control of the control module CM. The control module CM may control other modules, including but not limited to the image input module IIM and/or the sound input module AIM, based on touch signals received from the display panel DP.

The wireless communication module TM may transmit and receive a wireless signal to and from another terminal, for example, via a Bluetooth link or a Wi-Fi line. The wireless communication module TM may transmit and receive a voice signal via a communication line. The wireless communication module TM may include a transmitter TM1 and a receiver TM2. The transmitter TM1 may modulate and transmit signals, and the receiver TM2 may demodulate received signals.

The image input module IIM may process an image signal and convert it into image data for display on the display panel DP. The sound input module AIM may receive an external sound signal (e.g., obtained by a microphone in a recording mode, a voice recognition mode, etc.) and convert it into electrical voice data.

The external interface IF may connect to an external charger, a wired/wireless data port, a card socket (e.g., a memory card or a SIM/USIM card), and/or other features.

The second electronic module EM2 may include a sound output module AOM, light-emitting module LM, a light-receiving module LRM, a camera module CMM, and so forth. The modules may be mounted on a printed or flexible circuit board and may be electrically connected to the display panel DP or the first electronic module EM1.

The sound output module AOM may convert sound data, which is received from the wireless communication module TM or stored in the memory MM, and output the converted sound data externally.

The light-emitting module LM may generate and output light. In one embodiment, the light-emitting module LM may emit infrared light. The light-emitting module LM may include a light-emitting diode (LED) device, and the light-receiving module LRM may sense the infrared light. The light-receiving module LRM may be activated, for example, when incident infrared light has an intensity higher than a reference value. The light-receiving module LRM may include, for example, a CMOS sensor. The infrared light emitted from the light-emitting module LM may be reflected by an external object (e.g., a user's finger or face) and may be received by the light-receiving module LRM. The camera module CMM may be used to obtain an image of the external object.

The electronic module EM shown in FIG. 2 may receive an external input transmitted through the module hole MH or may provide an output signal through the module hole MH. The electronic module EM may include the first electronic module EM1 and/or the second electronic module EM2. Examples of the electronic module EM include a camera, a speaker, a light sensor, and a heat sensing sensor, in an embodiment, the electronic module EM may sense a signal of an external subject received through the module hole MH and may provide a sound (e.g., voice) signal to the outside through the module hole MH. The first electronic module EM1 and remaining elements of the second electronic module EM2 may be disposed at various positions. In an embodiment, the electronic module EM may include two or more of the modules included in the first electronic module EM1 and the second electronic module EM2.

In an embodiment, the display device DD may further include a transparent member between the electronic module EM and the display panel DP. The transparent member may be an optically transparent film, which allows an external input transferred through the module hole MH to pass through the transparent member and to the electronic module EM. The transparent member may be attached to the rear surface of the display panel DP or may be between the display panel DP and the electronic module EM without an additional adhesion layer.

In an embodiment, the electronic module EM may be inserted into the module hole MH. According to an embodiment of the inventive concept, since the module hole MH is formed in the display panel DP, it may be unnecessary to provide an additional space for the electronic module EM outside the non-display region NDA. In addition, since the module hole MH is defined in the hole region HA enclosed by the display region DA, the electronic module EM may be overlapped with the transmission region TA, not the light-blocking region CA. Thus, it may be possible to reduce the area of the light-blocking region CA, which, in turn, may allow the bezel of the display device DD to have a narrower or reduced size. Furthermore, in the case where the electronic module EM is provided in the module hole HM, it may be possible to reduce a thickness of the display device DD.

Figure 4:
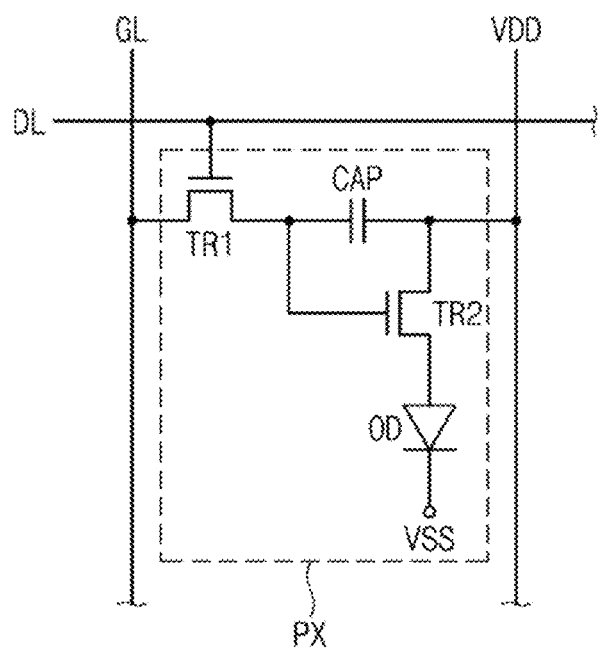
FIG. 4 illustrates an embodiment of a pixel of the display device in FIG. 1.
Figure 5:
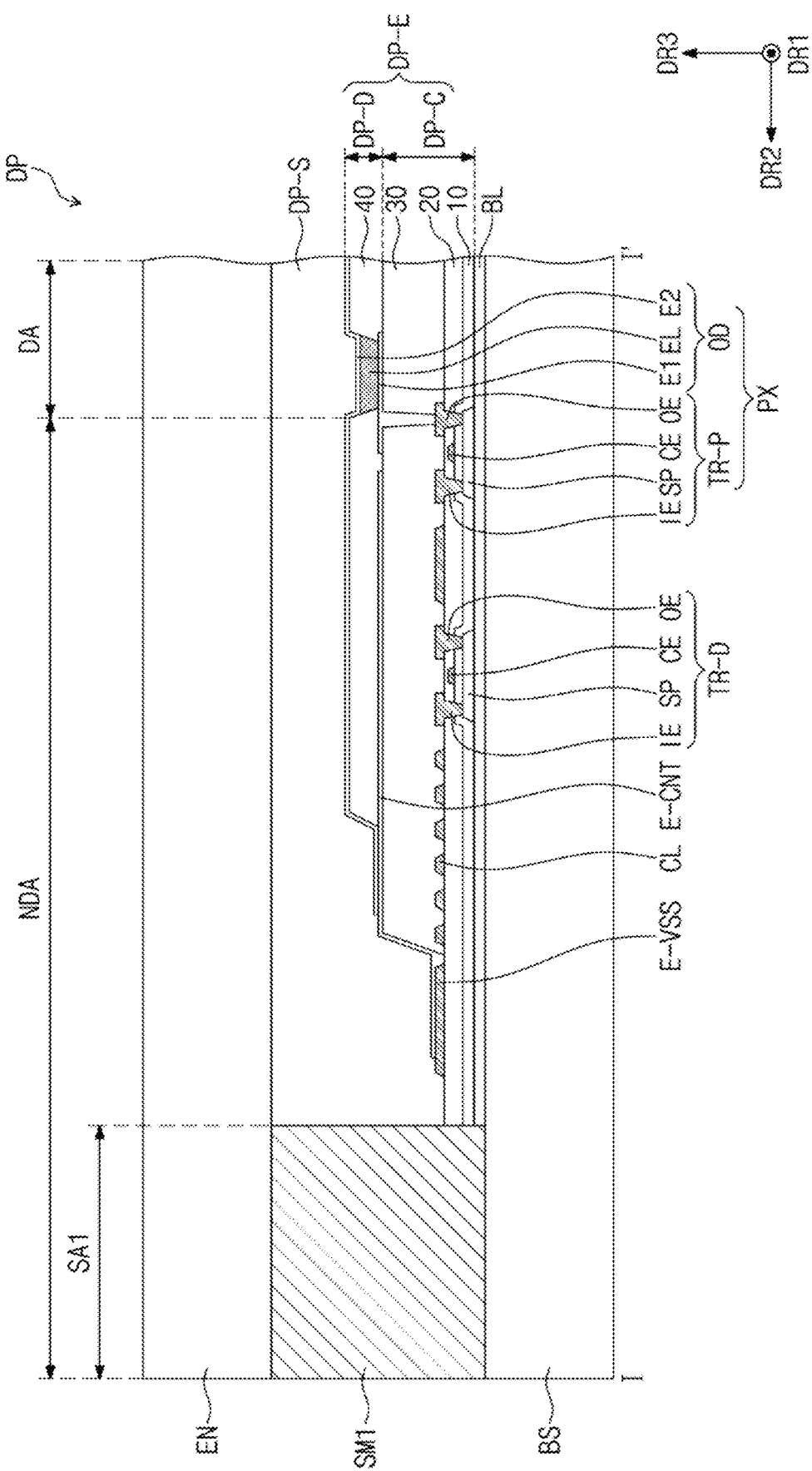
FIG. 5 illustrates a sectional view taken along line I-I' of FIG. 2.

FIG. 4 illustrates an embodiment of an equivalent circuit diagram of the pixel PX of FIG. 2. FIG. 5 illustrates a sectional view along line I-I' of FIG. 2.

Referring to FIGS. 4 and 5, the display panel DP may include a base substrate BS, a device layer DP-E, a filling layer DP-S, and an encapsulation substrate EN. The device layer DP-E and the filling layer DP-S may be between the base substrate BS and the encapsulation substrate EN. The device layer DP-E may be on the base substrate BS. The device layer DP-E and the base substrate BS may be included in a display substrate. The encapsulation substrate EN may cover the device layer DP-E. The device layer DP-E may include a circuit layer DP-C and a display layer DP-D. The circuit layer DP-C and the display layer DP-D may include components of the pixel PX.

The pixel PX may be included in the display region DA and may generate light to form the image IM. In an embodiment, a plurality of the pixels PX may be arranged on the display region DA.

As shown in FIG. 5, the pixel PX may be connected to a plurality of signal lines. In the present embodiment, a gate line GL, a data line DL, and a power line VDD are illustrated as examples of the signal lines. In one embodiment, the pixel PX may be connected to one or more other signal lines.

The pixel PX may include a first thin film transistor TR1, a capacitor CAP, a second thin film transistor TR2, and a light-emitting, element OD. In at least one embodiment, the remaining elements (e.g., the first thin film transistor TR1, the capacitor CAP, and the second thin film transistor TR2) of the pixel PX, other than the light-emitting element OD, may be referred to as a driving device.

The first thin film transistor TR1 may be a switching device to control an on/off switching operation of the pixel PX. The first thin film transistor TR1 may transmit or block a data signal transmitted through the data line DL based on a gate signal transmitted through the gate line GL.

The capacitor CAP may be connected to the first thin film transistor TR1 and the power line VDD. The capacitor CAP may store an amount of electric charges determined, for example, by a voltage difference between the data signal transmitted from the first thin film transistor TR1 and a first power voltage applied to the power line VDD.

The second thin film transistor TR2 may be connected to the first thin film transistor TR1, the capacitor CAP, and the light-emitting element OD. The second thin film transistor TR2 may control a driving current, flowing through the light-emitting element OD, based on the amount of charges stored in the capacitor CAP. A turn-on time of the second thin film transistor TR2 may be determined depending on the amount of charges stored in the capacitor CAP. During the turn-on time, the second thin film transistor TR2 may provide the first power voltage (which is transferred through the power line VDD) to the light-emitting element OD.

The light-emitting element OD may be connected to the second thin film transistor TR2 and a power terminal VSS. The light-emitting element OD may emit light with an intensity determined, for example, by a difference in voltage level between a signal transmitted through the second thin film transistor TR2 and a second power voltage received through the power terminal VSS. The light-emitting element OD may emit light during the turn-on time of the second thin film transistor TR2.

The light-emitting element OD may include an electroluminescent material. The color of light to be emitted from the light-emitting element OD may be determined depending on the kind of the electroluminescent material. In some embodiments, the color of light to be emitted from the light-emitting element OD may be one of red, green, blue, and white.

Examples of one of the thin film transistors (e.g., a pixel transistor TR-P) and the light-emitting element OD of the pixel PX are illustrated in FIG. 5. The pixel transistor TR-P may correspond to the second thin film transistor TR2 shown in FIG. 4.

The pixel transistor TR-P, along with a plurality of insulating layers (e.g., first to third insulating layers 10, 20, and 30), may be included in the circuit layer DP-C. Each of the first to third insulating layers 10, 20, and 30 may be formed of or include an organic material and/or an inorganic material and may have a single-layered structure or a stacked structure. The circuit layer DP-C may be on the base substrate BS. The base substrate BS may be an insulating substrate. For example, the base substrate BS may be formed of or include various insulating materials such as glass or plastic materials.

In an embodiment, the display panel DP may further include a functional layer BL between the base substrate BS and the device layer DP-E. The functional layer BL may be directly formed on the base substrate BS to cover a front surface of the base substrate BS.

The functional layer BL may be formed of or include an inorganic material. The functional layer BL may include a barrier layer and/or a buffer layer. Thus, the functional layer BL may prevent oxygen or moisture from entering the circuit layer DP-C or the display layer DP-D through the base substrate BS, and may allow the circuit layer DP-C to be stably formed on the base substrate BS. The inventive concept is not limited to a specific material of the functional layer BL. In certain embodiments, the functional layer BL may be omitted.

The pixel transistor TR-P may include a semiconductor pattern SP, a control electrode CE, an input electrode IE, and an output electrode OE. The semiconductor pattern SP may be disposed on the base substrate BS and may be formed of or include a semiconductor material. The control electrode CE may be spaced apart from the semiconductor pattern SP, with the first insulating layer 10 interposed therebetween.

The control electrode CE may be connected to one of the electrodes of the first thin film transistor TR1 and one electrode of the capacitor CAP illustrated in FIG. 4.

The input electrode IE and the output electrode OE may be spaced apart from the control electrode CE, with the second insulating layer 20 interposed therebetween. The input electrode IE and the output electrode OE of the pixel transistor TR-P may penetrate the first insulating layer 10 and the second insulating layer 20 and may be coupled to respective portions of the semiconductor pattern SP.

The third insulating layer 30 may be on the second insulating layer 20 and may cover the input electrode IE and the output electrode OE. In the pixel transistor TR-P, the semiconductor pattern SP may be on (or in contact with) the control electrode CE. In an embodiment, the semiconductor pattern SP may be on (or in contact with) the input electrode IE and the output electrode OE. In an embodiment, the input electrode IE and the output electrode OE may be on the same layer as that for the semiconductor pattern SP and may be directly coupled to the semiconductor pattern SP. The structure of the pixel transistor TR-P may be different in another embodiment.

The light-emitting element OD may be on the circuit layer DP-C. The light-emitting element OD, along with one of the insulating layers (e.g., a fourth insulating layer 40), may be included in the display layer DP-D. The light-emitting element OD may include a first electrode E1, a light emitting layer EL, and a second electrode E2. The fourth insulating layer 40 may be formed of or include an organic material and/or an inorganic material and may have a single-layered structure or a stacked structure.

The first electrode E1 may penetrate the third insulating layer 30 and may be coupled to the pixel transistor TR-P. The display panel DP may further include an additional connection electrode between the first electrode E1 and the pixel transistor TR-P. In this case, the first electrode E1 may be electrically coupled to the pixel transistor TR-P through the connection electrode.

The fourth insulating layer 40 may be on the third insulating layer 30. An opening may be defined in the fourth insulating layer 40 to expose at least a portion of the first electrode E1. The fourth insulating layer 40 may be a pixel definition layer.

The light emitting layer EL may be disposed in the opening and on the first electrode E1 exposed by the opening. The light emitting layer EL may include an electroluminescent material. In one embodiment, the light emitting layer EL may be formed of at least one of electroluminescent materials emitting red, green, or blue light and/or may include at least one of fluorescent or phosphorescent materials. The light emitting layer EL may be formed of or include an organic electroluminescent material or an inorganic electroluminescent material. The light emitting layer EL may emit a light based on a potential difference between the first electrode E1 and the second electrode E2.

The second electrode E2 may be on the light emitting layer EL, which faces the first electrode E1. The second electrode E2 may be a single body which extends from the display region DA to the non-display region NDA. The second electrode E2 may be provided in common to the plurality of pixels. Each of the pixels may include a light-emitting element OD, which may receive a common power voltage (e.g., a second power voltage) through the second electrode E2.

The second electrode E2 may be formed of or include a transparent conductive material or a transflective conductive material. Thus, light generated by the light emitting layer EL may be easily emitted in the third direction DR3 through the second electrode E2. In an embodiment, the light-emitting element OD may be designed to have a back-side emission structure, in which the first electrode E1 includes a transparent or transflective material, or a double-side emission structure, which allows for light emission through top and bottom surfaces thereof.

In an embodiment, the display panel DP may further include a thin film transistor TR-D (e.g., a driving transistor) and a plurality of signal patterns E-VSS, E-CNT, and CL, which are disposed on the non-display region NDA. The driving transistor TR-D and the signal patterns E-VSS, E-CNT, and CL may be included in the circuit layer DP-C.

In one example embodiment, the driving transistor TR-D may have a structure corresponding to the pixel transistor TR-P. For example, the driving transistor TR-D may include the semiconductor pattern SP disposed on the base substrate BS, the control electrode CE disposed on the first insulating layer 10, and the input electrode IE and the output electrode OE disposed on the second insulating layer 20. Thus, the pixel transistor TR-P and the driving transistor TR-D may be formed concurrently through the same process, which may simplify fabrication and reduce process costs, in an embodiment, the driving transistor TR-D may be formed to have a structure different from that of the pixel transistor TR-P.

The signal patterns E-VSS, E-CNT, and CL may include a power supplying line E-VSS, a connection electrode E-CNT, and a driving signal line CL. The power supplying line E-VSS may correspond to the power terminal VSS of the pixel PX. Thus, the power supplying line E-VSS may supply the second power voltage to the light-emitting element OD. In the present embodiment, the second power voltages may be supplied in common to all of the pixels PX.

The power supplying line E-VSS may be disposed on the second insulating layer 20 and may be included in the circuit layer DP-C. The power supplying line E-VSS may be formed concurrently with the input electrode IE or the output electrode OE of the driving transistor TR-D through the same process. In an embodiment, the power supplying line E-VSS may be on a layer different from the input electrode IE or the output electrode OE of the driving transistor TR-D, and may be separately formed by an additional process.

The connection electrode E-CNT may be on the third insulating layer 30 and in the display layer DP-D. The connection electrode E-CNT may be electrically coupled to the power supplying line E-VSS. The connection electrode E-CNT may extend from the third insulating layer 30 to cover a top surface of the power supplying line E-VSS exposed by the third insulating layer 30.

The second electrode E2 of the light-emitting element OD may extend from the display region DA and may be coupled to the connection electrode E-CNT. The connection electrode E-CNT may receive the second power voltage from the power supplying line E-VSS. Thus, the second power voltage may be delivered to the second electrode E2 through the connection electrode E-CNT and may be provided to each of the pixels.

The connection electrode E-CNT may be on the same layer as the first electrode E1 of the light-emitting element OD and may be formed concurrently with the first electrode E1. In an embodiment, the connection electrode E-CNT may be on a layer different from the first electrode E1.

In an embodiment, a plurality of the driving signal lines CL may be on the second insulating layer 20 and located in the non-display region NDA. The driving signal lines CL may be routing lines connected to one or more pads or may be a line included in an integrated circuit (IC). The driving signal lines CL may be spaced apart from each other in the first direction DR1 and may be used to deliver respective electrical signals in an independent manner.

The filling layer DP-S may be between the device layer DP-E and the encapsulation substrate EN. In an embodiment, the filling layer DP-S may include an inert gas. The filling layer DP-S may prevent contamination or extraneous material, which may exist between the device layer DP-E and the encapsulation substrate EN, from being diffused.

Figure 6:
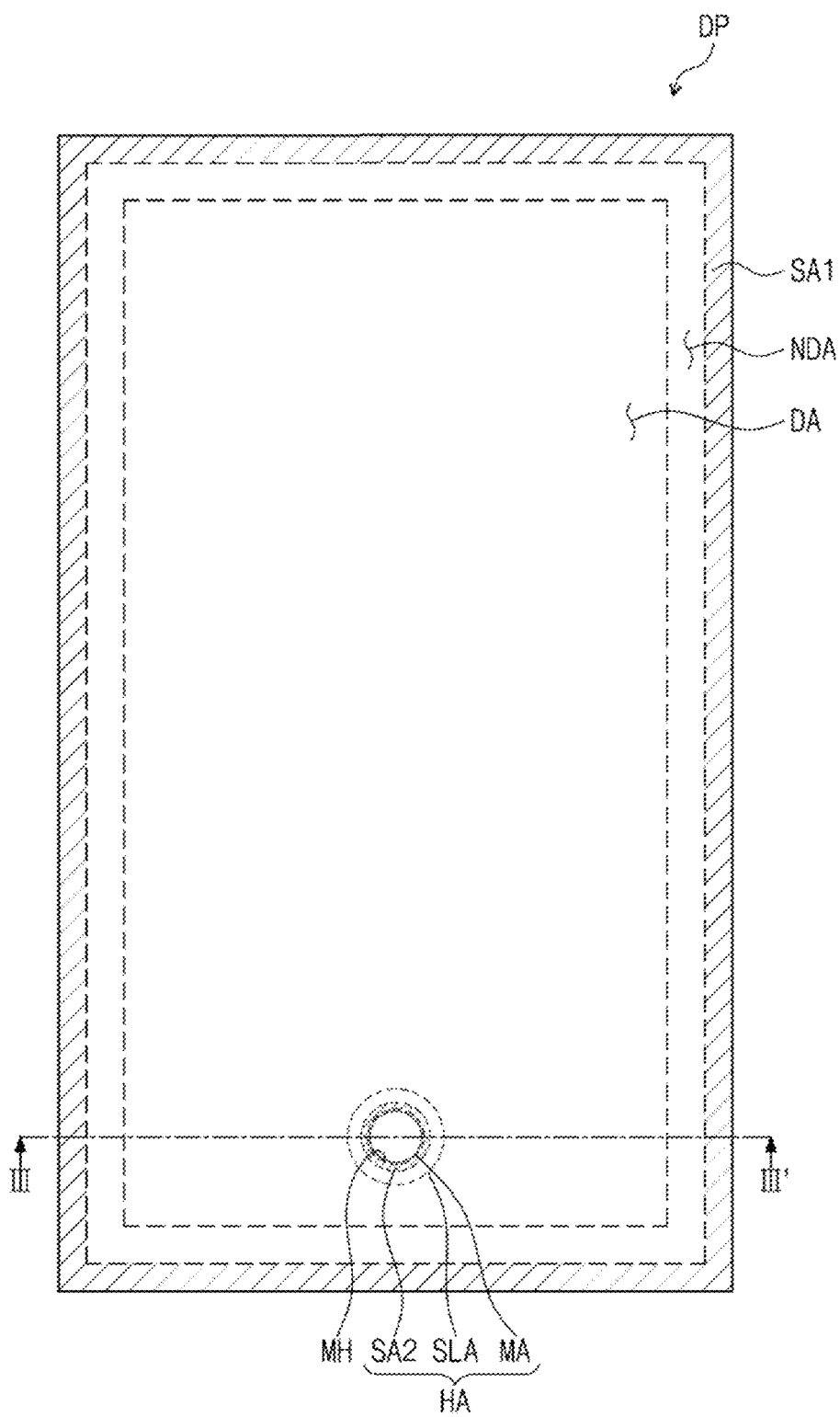
FIG. 6 illustrates an embodiment of display panel.
Figure 7:
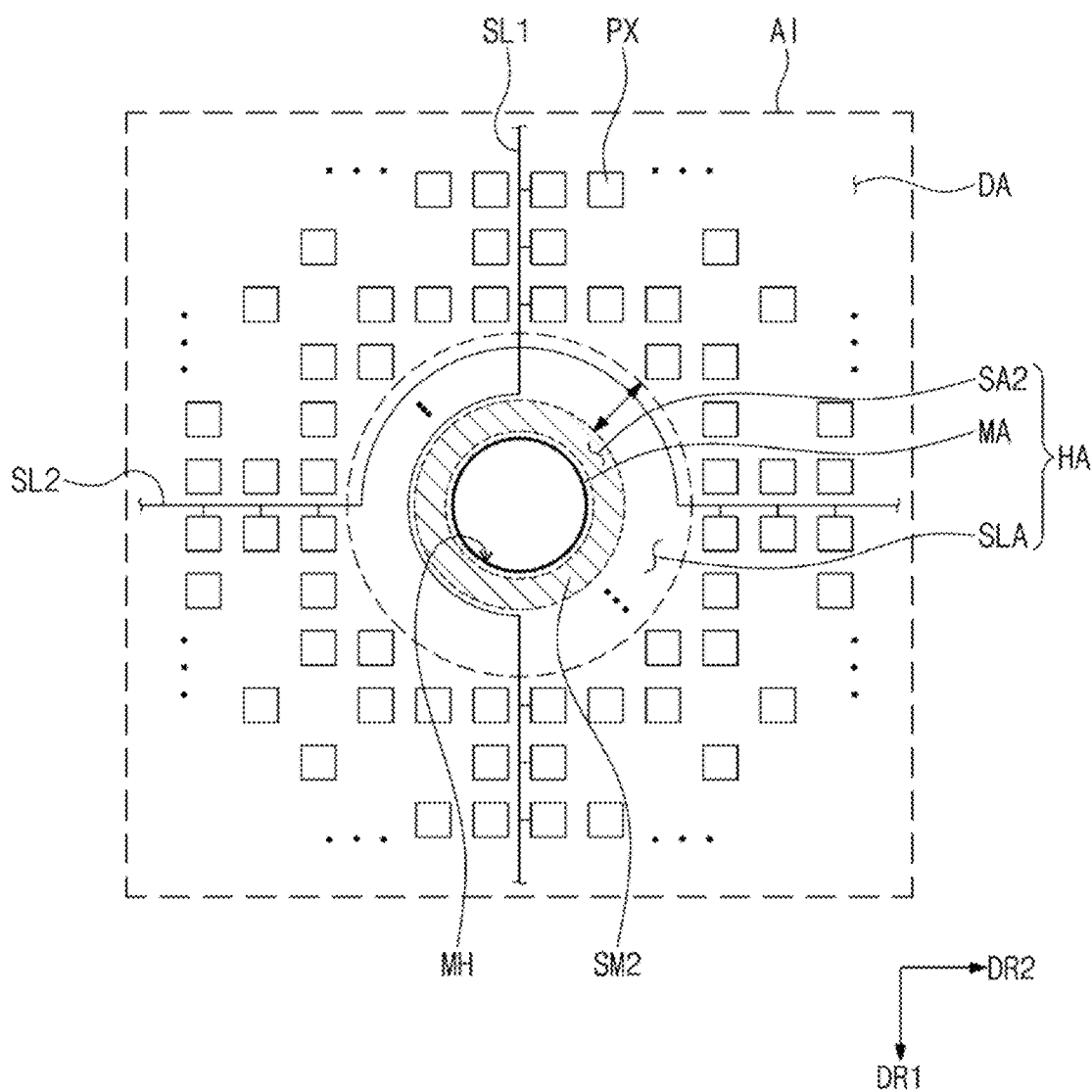
FIG. 7 illustrates an embodiment of region A1 in FIG. 2.
Figure 8:
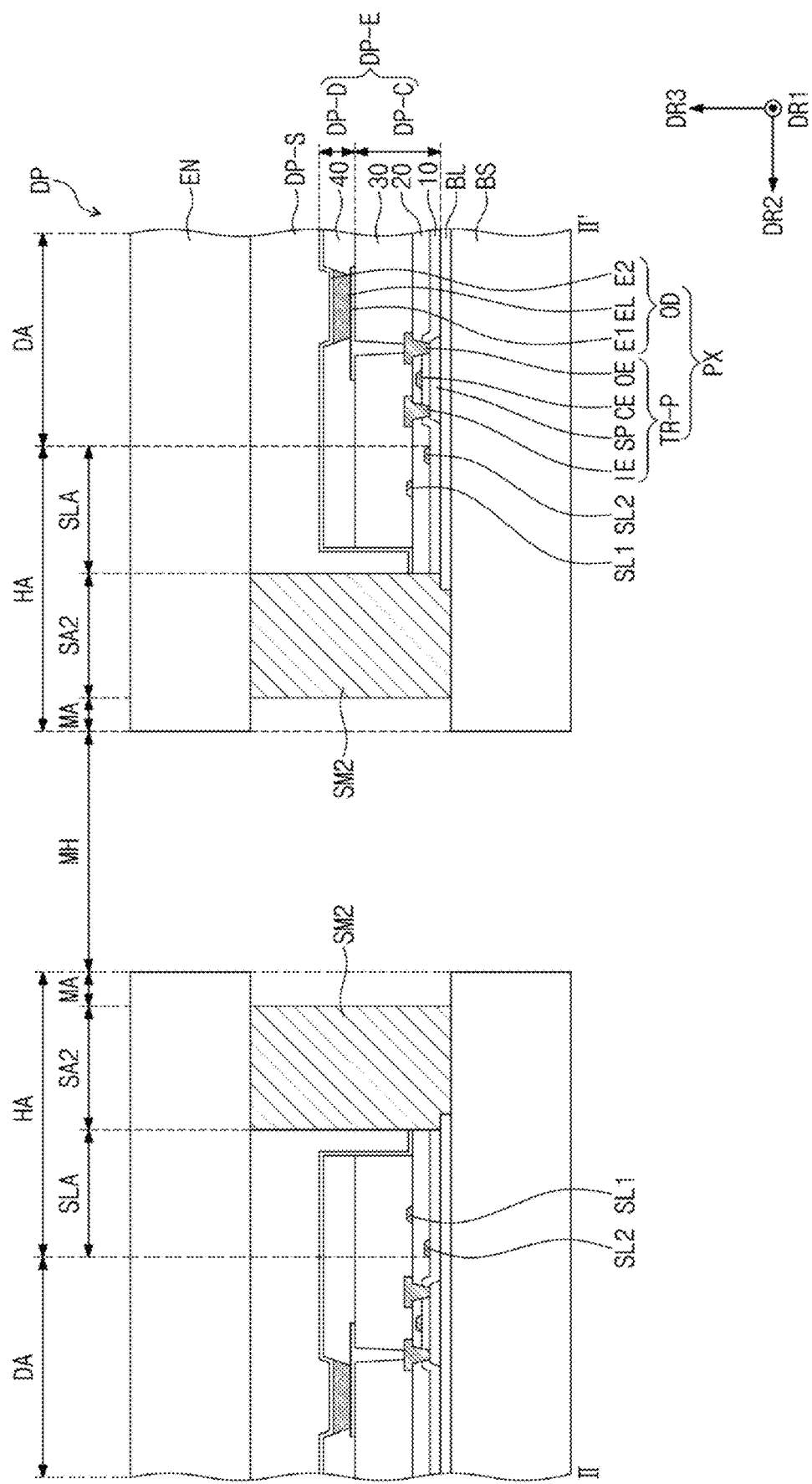
FIG. 8 illustrates a sectional view taken along line II-II' of FIG. 2.

FIG. 6 illustrates an embodiment of a display panel, FIG. 7 illustrates an enlarged plan view of region A1 in FIG. 2, and FIG. 8 illustrates a sectional view taken along line II-II' of FIG. 2.

Referring to FIGS. 6 to 8 in conjunction with FIGS. 4 and 5, the non-display region NDA may have a frame shape enclosing the display region DA. The non-display region NDA of the display panel DP may include a substrate-sealing region SA1. The substrate-sealing region SA1 may be defined along an edge of the non-display region NDA.

As described above, the hole region HA of the display panel DP may be enclosed or surrounded by the display region DA. In one embodiment, the hole region HA may have a ring shape enclosing the module hole MH.

The pixels PX may be arranged to enclose the hole region HA. Some of the pixels PX may be arranged along an edge of the hole region HA. The pixels PX may be spaced apart from the module hole MH, when viewed in a plan view.

The hole region HA may include a hole-sealing region SA2, a wiring region SLA, and a margin region MA. The margin region MA may have a ring shape enclosing the module hole MH. The hole-sealing region SA2 may be outside the margin region MA and may have a ring shape enclosing the margin region MA. According to an embodiment of the inventive concept, the display substrate and the encapsulation substrate EN may be combined with each other in the hole-sealing region SA2. In the present embodiment, a width of the hole-sealing region SA2 may be less than about 100 μm, but may have a different width in another embodiment.

The wiring region SLA may be outside the hole-sealing region SA2 and may have a ring shape enclosing the hole-sealing region SA2. In the wiring region SLA, the display substrate and the encapsulation substrate EN may be spaced apart from each other by a specific distance. In other words, the display substrate and the encapsulation substrate EN may not be combined with each other in the wiring region SLA.

A plurality of signal lines SL1 and SL2 connected to the pixels PX may be provided in the wiring region SLA. For convenience in illustration, some (e.g., a first signal line SL1 and a second signal line SL2) of the signal lines connected to the pixels PX are exemplarily illustrated in FIG. 7.

In the display region DA, the first signal line SL1 may extend in the first direction DR1 and may be connected to some of the pixels PX, which are arranged in the first direction DR1 to form a single column. The first signal line SL1 may correspond, for example, to the data line DL (e.g., see FIG. 4).

In the wiring region SLA, the first signal line SL1 may have a curved shape. For example, as illustrated in FIG. 7, the first signal line SL1 in the wiring region SLA may extend along an outer circumference of the module hole MH, and therefore may have a semi-circular shape. The first signal line SL1 may have a different shape in the wiring region SLA in another embodiment.

When viewed in a plan view, some of the pixels connected to the first signal line SL1 may be above the module hole MH and other pixels may be below the module hole MH. Thus, the pixels, which are connected to the first signal line SL1 and are included in the same column, may receive the same data signal through the same line, in spite of the presence of the module hole MH between the pixels in the same column.

In the display region DA, the second signal line SL2 may extend in the second direction DR2 and may be connected in common to the pixels PX, which are arranged in the second direction DR2 in the same row. The second signal line SL2 may correspond, for example, to the gate line GL (e.g., see FIG. 4).

In the wiring region SLA, the second signal line SL2 may have a curved shape. For example, as illustrated in FIG. 7, the second signal line SL2 in the wiring region SLA may extend along the outer circumference of the module hole MH, and therefore may have a semi-circular shape. The second signal line SL2 may have a different shape in the wiring region SLA in another embodiment.

When viewed in a plan view, some of the pixels connected to the second signal line SL2 may be on the left side of the module hole MH and other pixels may be on the right side of the module hole MH. Thus, the pixels, which are connected to the second signal line SL2 in the same row, may be turned on or off by substantially the same gate signal, in spite of the presence of the module hole MH between the pixels in the same row.

The margin region MA may be between the hole-sealing region SA2 and the module hole MH. The margin region MA may prevent the hole-sealing region SA2 from being damaged by variations in a patterning process, which may occur when the module hole MH is formed after a bonding process between the display substrate and the encapsulation substrate EN. The display substrate and the encapsulation substrate EN are bonded in the hole-sealing region SA2.

In the present embodiment, the display substrate and the encapsulation substrate EN may be bonded to each other in the substrate-sealing region SA1 and the hole-sealing region SA2. For example, as shown in FIGS. 5 and 8, the display panel DP may further include a substrate-sealing member SM1 and a hole-sealing member SM2, which are respectively disposed in the substrate-sealing region SA1 and the hole-sealing region SA2. The substrate-sealing member SM1 may be between the display substrate and the encapsulation substrate EN and in the substrate-sealing region SA1. The hole-sealing member SM2 may be between the display substrate and the encapsulation substrate EN and in the hole-sealing region SA2. The thickness of each of the substrate-sealing member SM1 and the hole-sealing member SM2 may range, for example, from about 4.5 μm to about 5.5 μm.

Each of the substrate-sealing member SM1 and the hole-sealing member SM2 may be formed of or include a glass material. For example, each of the substrate-sealing member SM1 and the hole-sealing member SM2 may be provided in the melted state of frit containing glass powder.

In the present embodiment, the substrate-sealing member SM1 and the hole-sealing member SM2 may include the same material, but may include different materials in another embodiment. In certain embodiments, the hole-sealing member SM2 may include glass material, but the substrate-sealing member SM1 may not include glass material.

In the present embodiment, the display substrate and the encapsulation substrate EN may be bonded in the substrate-sealing region SA1 by the substrate-sealing member SM1.

In one embodiment, the display substrate and the encapsulation substrate EN may be bonded in the hole-sealing region SA2 enclosing the module hole MH by the hole-sealing member SM2. Thus, it may be possible to prevent moisture or contamination material from entering the device layer DP-E between the display substrate and the encapsulation substrate EN.

Figure 9:
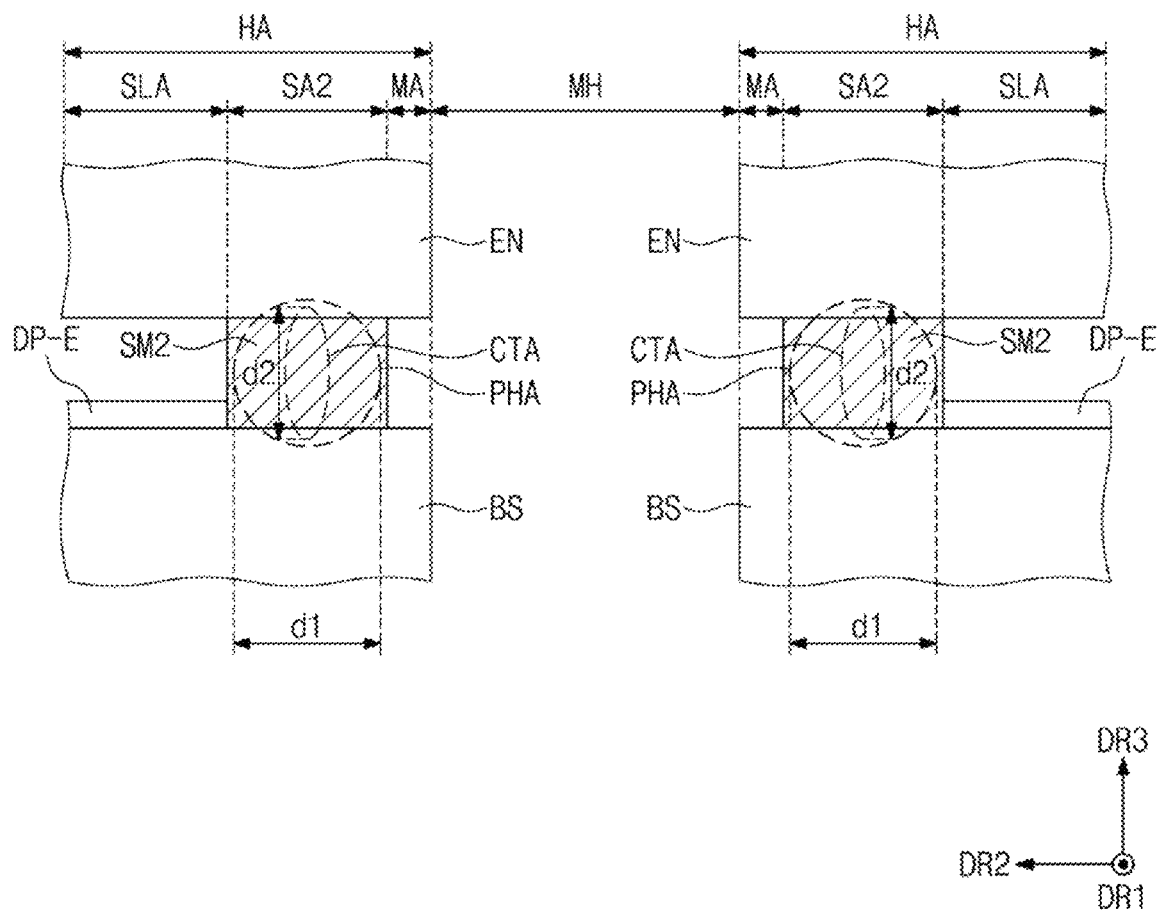
FIG. 9 illustrates a sectional view of a bonding region according to an embodiment.

FIG. 9 illustrates a sectional view of a bonding region between a display substrate and an encapsulation substrate according to one embodiment. For convenience in description, the device layer DP-E is partially illustrated in FIG. 9.

According to an embodiment of the inventive concept, the display substrate and the encapsulation substrate EN in at least the hole-sealing region SA2 may be bonded to each other by a first laser. For example, the first laser may be irradiated onto the hole-sealing region SA2. The first laser may be, for example, an ultra-high-frequency pulsed laser. In one embodiment, the first laser may be a femtosecond laser. The term "femtosecond laser" may be understood to include a laser having a pulse duration less than a picosecond or is on the order of femtoseconds.

In the case where the first laser is irradiated onto the hole-sealing region SA2, a bonding region PHA may be formed between the display substrate and the encapsulation substrate EN in the hole-sealing region SA2. The bonding region PHA may have a spherical shape. In the present embodiment, the bonding region PHA may be formed across an interface between the hole-sealing member SM2 and the encapsulation substrate EN or an interface between the hole-sealing member SM2 and the base substrate BS. A width d1 of the bonding region PHA may range, for example, from about 70 µm to about 100 µm. The bonding region PHA may have a different shape or width d1 in another embodiment.

In the present embodiment, the bonding region PHA may be a region absorbing an energy of the first laser. In the case where the first laser is irradiated to the base substrate BS, the hole-sealing member SM2, and the encapsulation substrate EN, each of the base substrate BS, the hole-sealing member SM2, and the encapsulation substrate EN may absorb the energy of the first laser and may experience a change of state. For example, in the case where the first laser is irradiated to the base substrate BS, the hole-sealing member SM2, and the encapsulation substrate EN, at least a portion of each of the base substrate BS, the hole-sealing member SM2, and the encapsulation substrate EN may be melted and mixed with each other in the bonding region PHA. Thus, in the case where a contact surface between the hole-sealing member SM2 and the encapsulation substrate EN, or a contact surface between the hole-sealing member SM2 and the base substrate BS, is overlapped with the bonding region PHA, at least a portion of the interface between the hole-sealing member SM2 and the encapsulation substrate EN or at least a portion of the interface between the hole-sealing member SM2 and the base substrate BS may become unclear.

The bonding region PHA may include a focus region CTA formed at a predetermined position (e.g., center) of the bonding region PHA. The focus region CTA may correspond to a region which includes a focal point of the first laser and may be defined as a portion of the bonding region PHA at which the energy of the first laser is concentrated and which has the highest energy absorptivity. When viewed in a sectional view, the focus region CTA may have an elliptical shape with a longitudinal axis parallel to the third direction DR3. A length d2 of the longitudinal axis may be less than 200 µm, for example. The focus region CTA may have a different shape in another embodiment. For example, in an embodiment, the focus region CTA may have a circular shape, a water droplet shape, or a polygonal shape, when viewed in a sectional view.

Figure 10A:
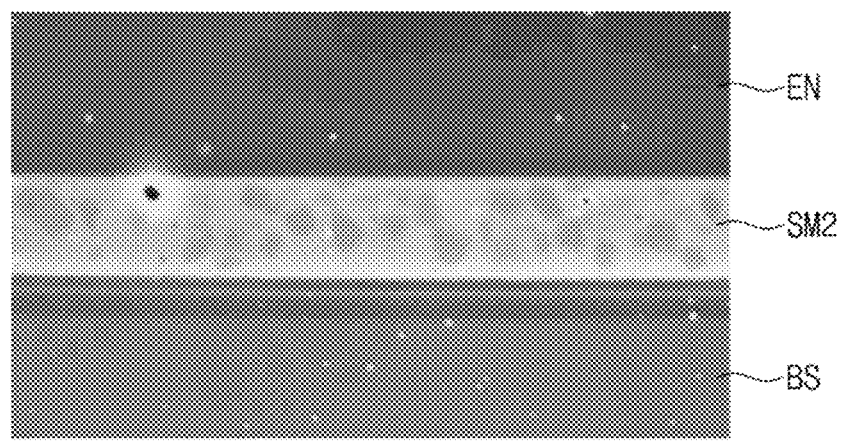
FIG. 10A illustrates an embodiment of a hole-sealing region before irradiation of a first laser in an embodiment.
Figure 10B:
FIG. 10B illustrates an embodiment of a bonding region formed in the hole-sealing region after irradiation of the first laser.

FIG. 10A illustrates an example of an image showing an enlarged shape of a hole-sealing region before irradiation of the first laser, and FIG. 10B illustrates an example of an image showing an enlarged shape of a bonding region formed in the hole-sealing region after irradiation of the first laser. As illustrated in FIG. 10A, the interface between the hole-sealing member SM2 and the encapsulation substrate EN, and the interface between the hole-sealing member SM2 and the base substrate BS, were distinct before the first laser was irradiated onto the hole-sealing region. As shown in FIG. 10B, after the first laser was irradiated to the hole-sealing region, the interface between the hole-sealing member SM2 and the encapsulation substrate EN and the interface between the hole-sealing member SM2 and the base substrate BS became vague.

According to an embodiment of the inventive concept, when the first laser (e.g., outputting a pulsed energy beam of an ultra-high frequency) is used to bond the base substrate BS and the encapsulation substrate EN in the hole-sealing region SA2, the base substrate BS, the hole-sealing member SM2, and the encapsulation substrate EN corresponding to the hole-sealing region SA2 may absorb the energy nonlinearly to form the bonding region PHA. For example, at least a portion of each of the base substrate BS, the hole-sealing member SM2, and the encapsulation substrate EN in the bonding region PHA may experience a change of state and then may be mixed to each other at its interface. This may lead to an increase in bonding strength between the base substrate BS, the hole-sealing member SM2, and the encapsulation substrate EN. Thus, according to an embodiment of the inventive concept, it may be possible to increase the durability of the display device DD.

In addition, according to an embodiment of the inventive concept, even when a width of the hole-sealing region SA2 is reduced, the display substrate and the encapsulation substrate EN may not be delaminated or damaged. In one embodiment of the inventive concept, the width of the hole-sealing region SA2 may be less than about 100 µm, as described above. Thus, a dead space around the module hole MH may be reduced, making it possible to improve the aesthetic appearance of the display device DD. The width of the hole-sealing region SA2 may be different in another embodiment.

In the above embodiments, an example is discussed where the first laser is irradiated onto the hole-sealing region SA2, in another embodiment, the first laser may be irradiated onto the substrate-sealing region. SA1 in order to bond the base substrate BS and the encapsulation substrate EN.

Furthermore, in the present embodiment, the display panel DP may include the substrate-sealing member SM1 and the hole-sealing member SM2. In another embodiment, at least one of the substrate-sealing member SM1 and the hole-sealing member SM2 may be omitted. In this case, in the sealing region SA1 or SA2 (from which the sealing member SM1 or SM2 is omitted), a portion of each of the top surface of the display substrate (e.g., the base substrate BS) and the bottom surface of the encapsulation substrate EN may be melted by the first laser and mixed. The display substrate and the encapsulation substrate EN may be bonded by the mixing of the melted portions of the base and encapsulation substrates BS and EN in the sealing region SA1 or SA2.

Figure 11:
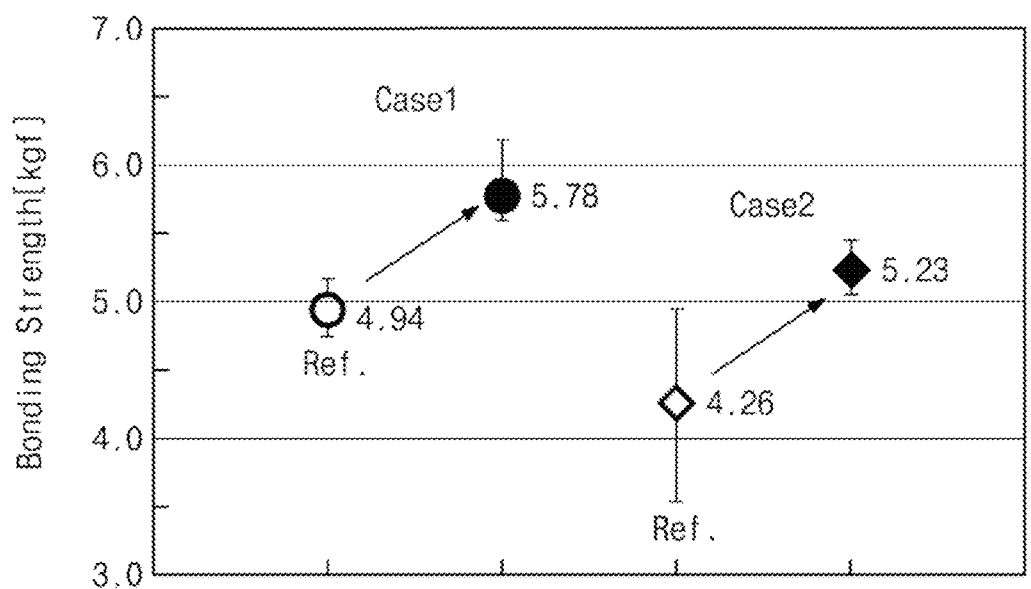
FIG. 11 illustrates an example of a change in bonding strength of a display panel.

FIG. 11 illustrates a graph showing an example of a change in bonding strength of a display panel that may take place according to an embodiment of the inventive concept. In Case 1 of FIG. 11, when a laser (e.g., CW laser) having a longer oscillation duration time than the first laser was used to bond the base substrate BS and the encapsulation substrate EN, the bonding strength between the base substrate BS and the encapsulation substrate EN was about 4.94 kgf. When the first laser according to an embodiment of the inventive concept was used to bond the base substrate BS and the encapsulation substrate EN, the bonding strength between the base substrate BS and the encapsulation substrate EN was about 5.78 kgf.

In Case 2 of FIG. 11, when a laser (e.g., CW laser) having a longer oscillation duration time than the first laser was used to bond the base substrate BS and the encapsulation substrate EN, the bonding strength between the base substrate BS and the encapsulation substrate EN was about 4.26 kgf. When the first laser according to an embodiment of the inventive concept was used to bond the base substrate BS and the encapsulation substrate EN, the bonding strength between the base substrate BS and the encapsulation substrate EN was about 5.23 kgf. Thus, as shown in Cases 1 and 2, it may be possible to increase bonding strength in the case where the first laser is used to bond the display panel DP, compared to the case of using other lasers.

Figure 12:
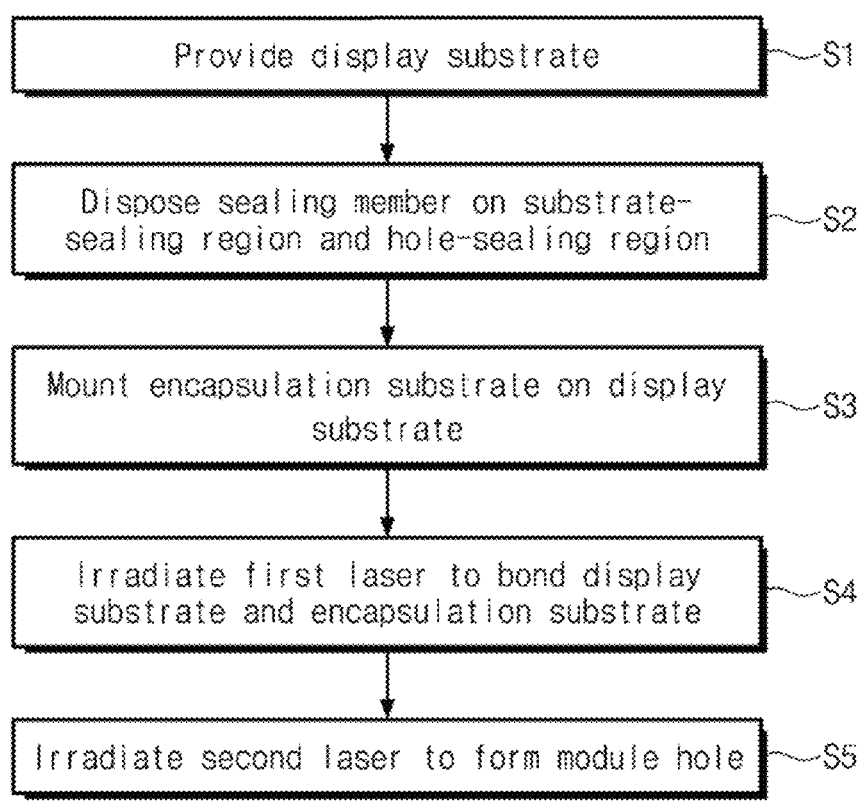
FIG. 12 illustrates an embodiment of a method of fabricating a display device.

FIG. 12 illustrates a method for fabricating a display device according to an embodiment of the inventive concept, and FIGS. 13A to 13E illustrate sectional views of a process of fabricating a display device according to an embodiment of the inventive concept. Hereinafter, a method of fabricating the display panel DP will be described with reference to FIG. 12 and FIGS. 13A to 13E.

Figure 13A:
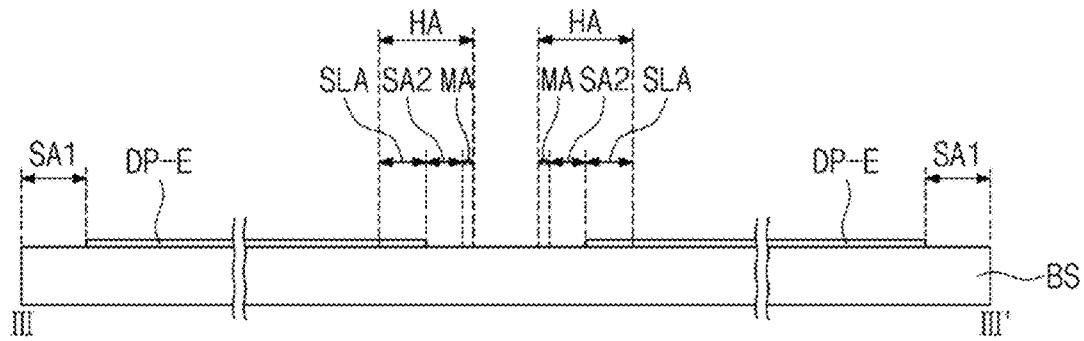
FIGS. 13A to 13E illustrate different stages of a process of fabricating a display device according to an embodiment.
Figure 13A:
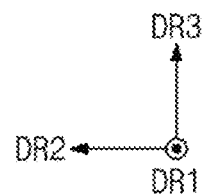

As illustrated in FIGS. 12 and 13A, the method includes providing a display substrate (S1). Providing the display substrate may include, for example, forming the device layer DP-E on the base substrate BS. The device layer DP-E may include a plurality of the pixels PX. The device layer DP-E may not be overlapped with the substrate-sealing region SA1 and the hole-sealing region SA2. The base substrate BS and the device layer DP-E may constitute the display substrate.

Figure 13B:
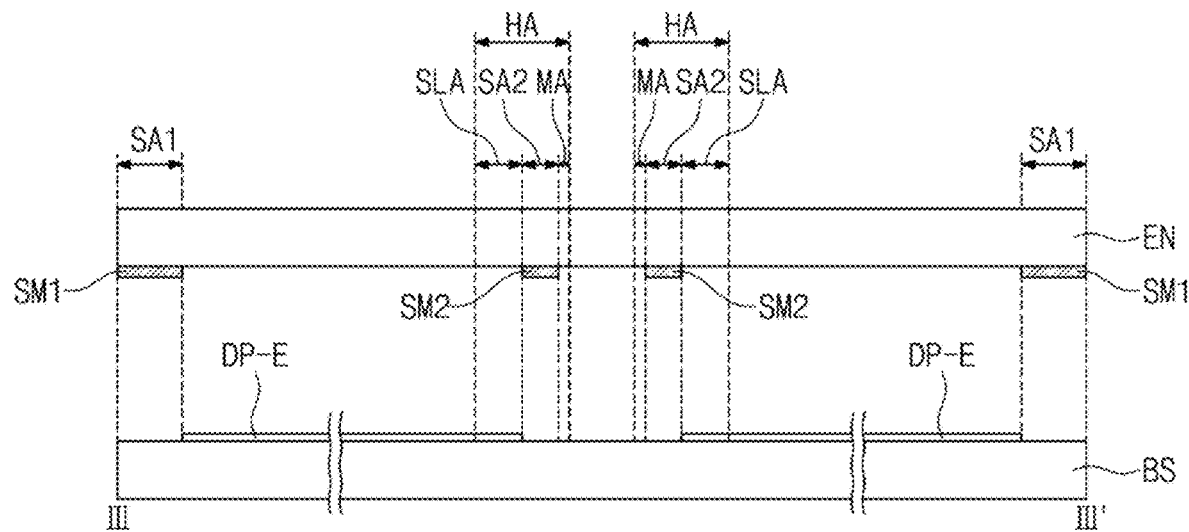
Figure 13B:
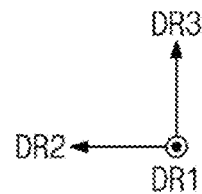

Thereafter, as illustrated in FIGS. 12 and 13B, the substrate-sealing member SM1 and the hole-sealing member SM2 may be disposed on the encapsulation substrate EN (S2). In one embodiment, the substrate-sealing member SM1 may be disposed on the substrate-sealing region SA1 and the hole-sealing member SM2 may be disposed on the hole-sealing region SA2. According to an embodiment of the inventive concept, the width of the hole-sealing region SA2 may be smaller than or equal to the width of the substrate-sealing region SA1. For example, the width of the hole-sealing region SA2 may be smaller than or equal to about 100 µm.

Figure 13C:
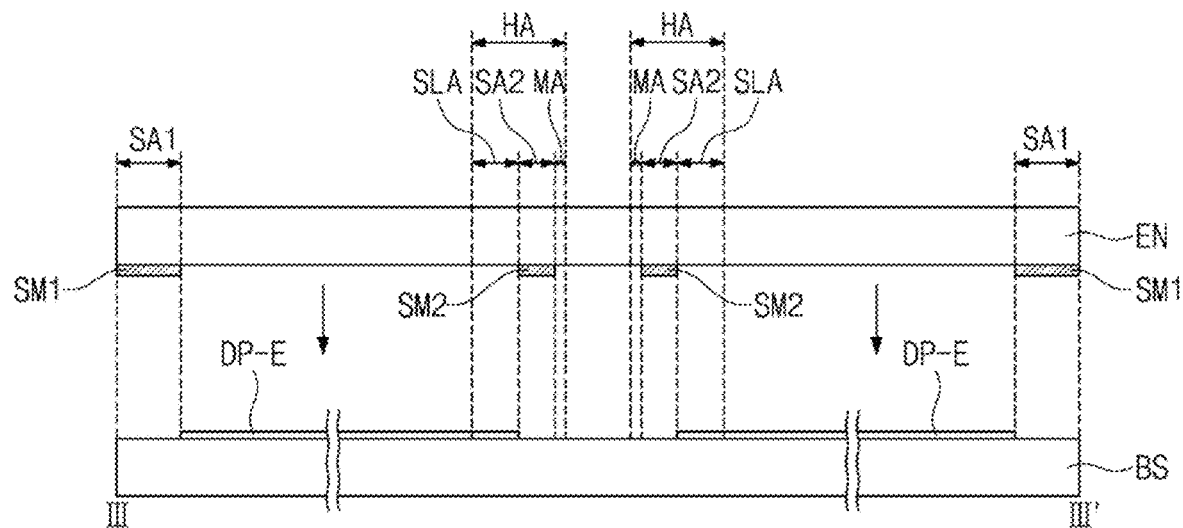

Next, as shown in FIGS. 12 and 13C, the encapsulation substrate EN may be mounted on the display substrate (S3). The encapsulation substrate EN and the base substrate BS may face each other, with the device layer DP-E interposed therebetween. The mounting of the encapsulation substrate EN on the display substrate may further include filling a region between the encapsulation substrate EN and the display substrate with the filling layer DP-S (e.g., see FIGS. 5 and 8).

Figure 13D:
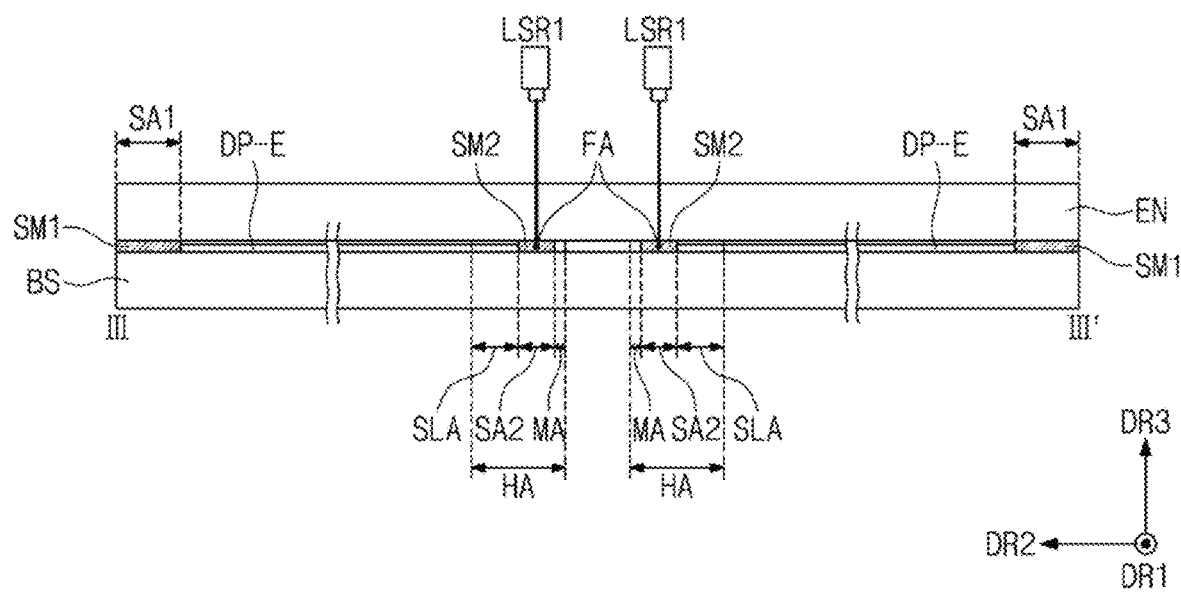

Thereafter, as shown in FIGS. 12 and 13D, a first laser LSR1 may be irradiated onto the hole-sealing region SA2 to bond the display substrate and the encapsulation substrate EN (S4). In the present embodiment, a focal point FA of the first laser LSR1 may be formed in a region between the display substrate and the encapsulation substrate EN and may correspond to the hole-sealing region SA2. The focal point FA of the first laser LSR1 may be continuously moved along an interface region between the display substrate and the encapsulation substrate EN.

Bonding of the display substrate and the encapsulation substrate EN (S4) may further include irradiating a laser onto the substrate-sealing region SA1. The laser irradiated onto the substrate-sealing region SA1 may be the first laser LSR1, but in certain embodiments, it may be different from the first laser LSR1.

Figure 13E:
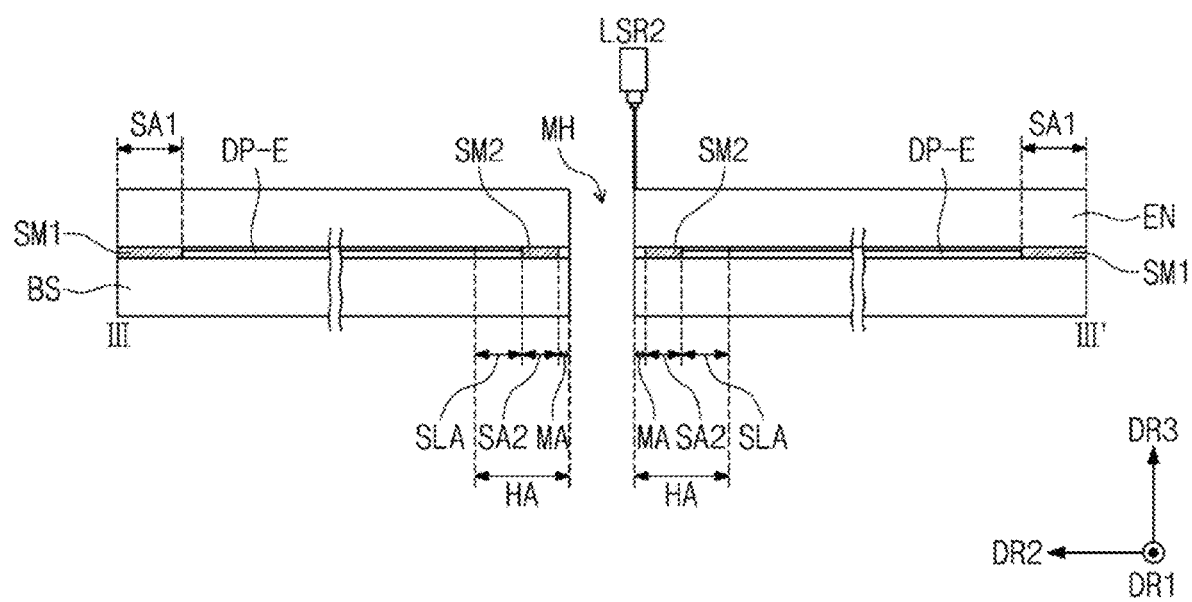

After bonding of the display substrate and the encapsulation substrate EN, a second laser LSR2 may be irradiated onto an area of a display panel, in which the bonded structure of the display substrate and the encapsulation substrate EN is provided, to form the module hole MH (S5), as illustrated in FIGS. 12 and 13E. In one embodiment, the oscillation duration time of the second laser LSR2 may be longer than the oscillation duration time of the first laser LSR1. For example, the second laser LSR2 may be a continuous wave (CW) laser. When viewed in a plan view, a region including the module hole MH may be enclosed by the hole-sealing region SA2 and the margin region MA.

The inventive concept is not limited to a specific method of forming the module hole MH. For example, in an embodiment, the module hole MH may be formed by a process different from a laser cutting process. According to one embodiment of the inventive concept, a method of fabricating the display device DD may further include disposing an electronic module (e.g., EM of FIG. 2) to correspond to the module hole MH in the display panel DP.

Figure 14A:
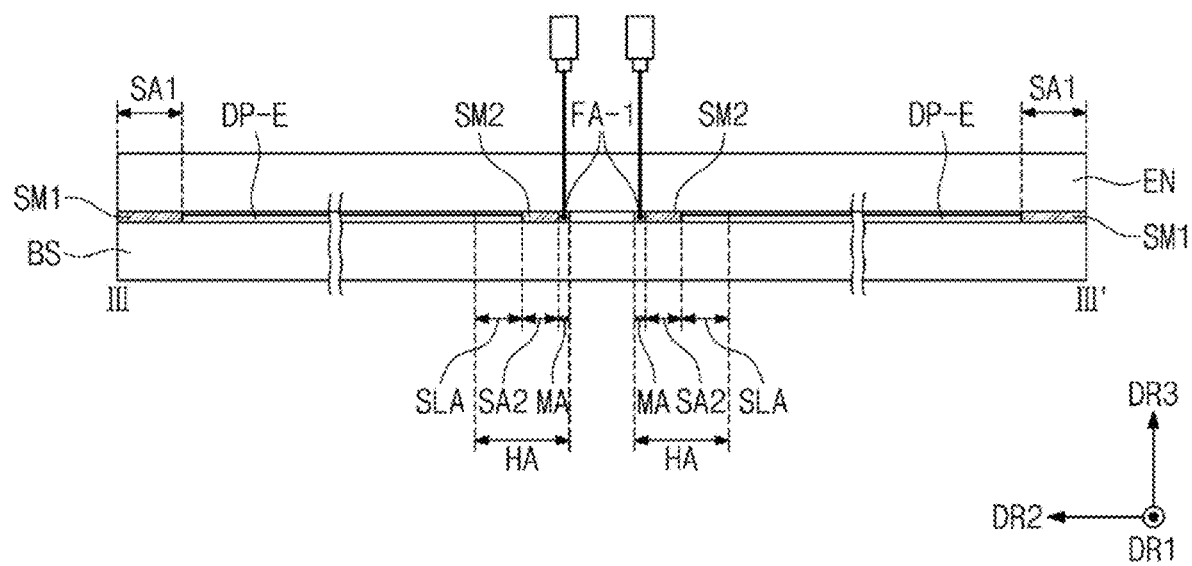
FIGS. 14A and 14B illustrate a process of fabricating a display device according to embodiments.
Figure 14B:
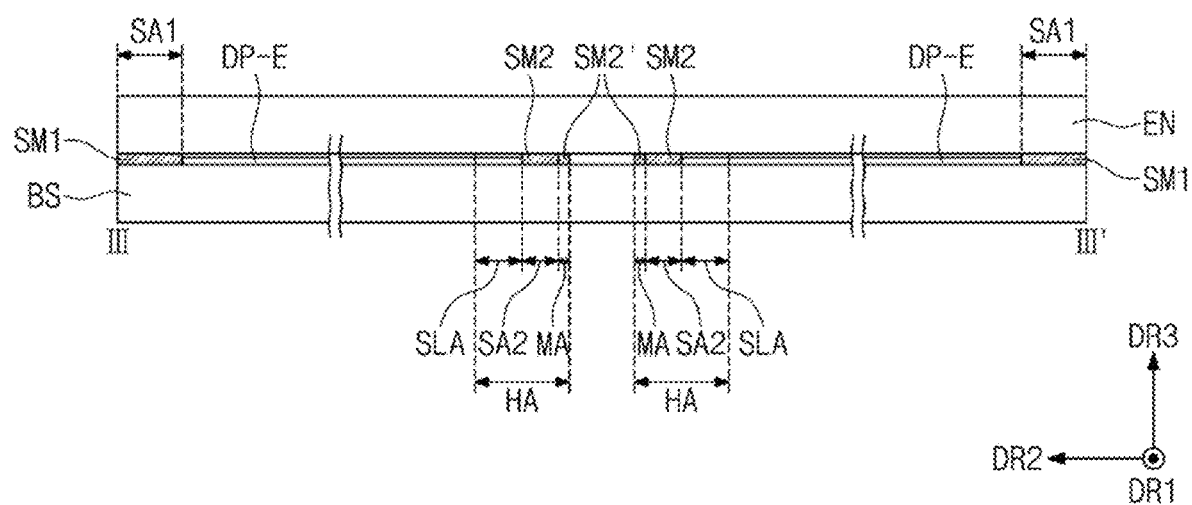

FIGS. 14A and 14B illustrate sectional views of a process of fabricating a display device according to another embodiment of the inventive concept. FIGS. 14A and 14B illustrate an embodiment, in which bonding of the display substrate and the encapsulation substrate (S4 of FIG. 12) is performed in a different manner. The fabrication process according to the present embodiment may be performed in the same manner as in the previous embodiments, except for the operation illustrated in FIG. 13D. Thus, a detailed description of other operations (e.g., S1, S2, S3, and S5), except for the bonding of the display substrate and the encapsulation substrate (S4 of FIG. 12), will be omitted.

As illustrated in FIG. 14A, according to another embodiment of the inventive concept, a focal point FA-1 of the first laser LSR1 may be formed in a region between the base substrate BS and the encapsulation substrate EN and may correspond to the margin region MA and not to the hole-sealing region SA2. The bonding region (e.g., PHA of FIG. 9) formed by the first laser LSR1 may be overlapped with the margin region MA and the hole-sealing region SA2.

For example, when the first laser LSR1 is irradiated on the margin region MA, a portion of the front surface of the base substrate BS and a portion of the rear surface of the encapsulation substrate EN in the margin region MA may be melted. Also, a portion of each of the hole-sealing member SM2, the base substrate BS, and the encapsulation substrate EN in the hole-sealing region SA2 may be melted. In this case, at least a portion of SM2' of the hole-sealing member SM2 in the hole-sealing region SA2 may overflow into the margin region MA. In the present embodiment, the display substrate and the encapsulation substrate EN may be bonded to each other in the margin region MA and the hole-sealing region SA2.

Figure 15A:
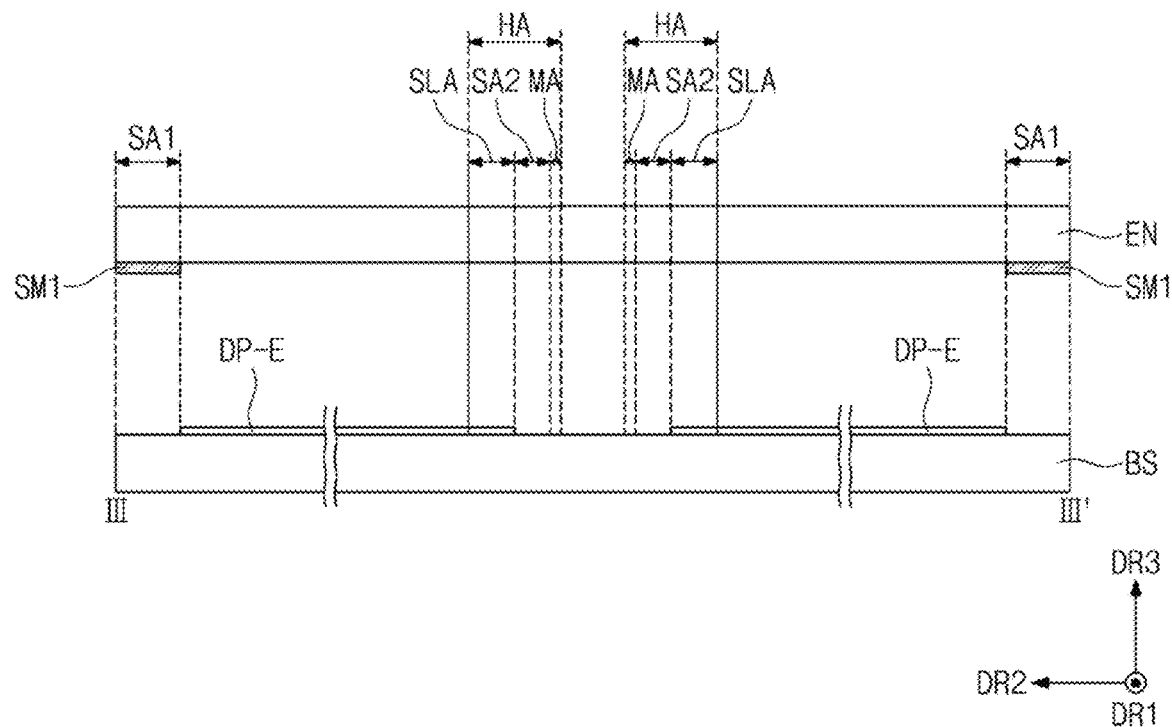
FIGS. 15A to 15D illustrate a process of fabricating a display device according to embodiments.
Figure 15B:
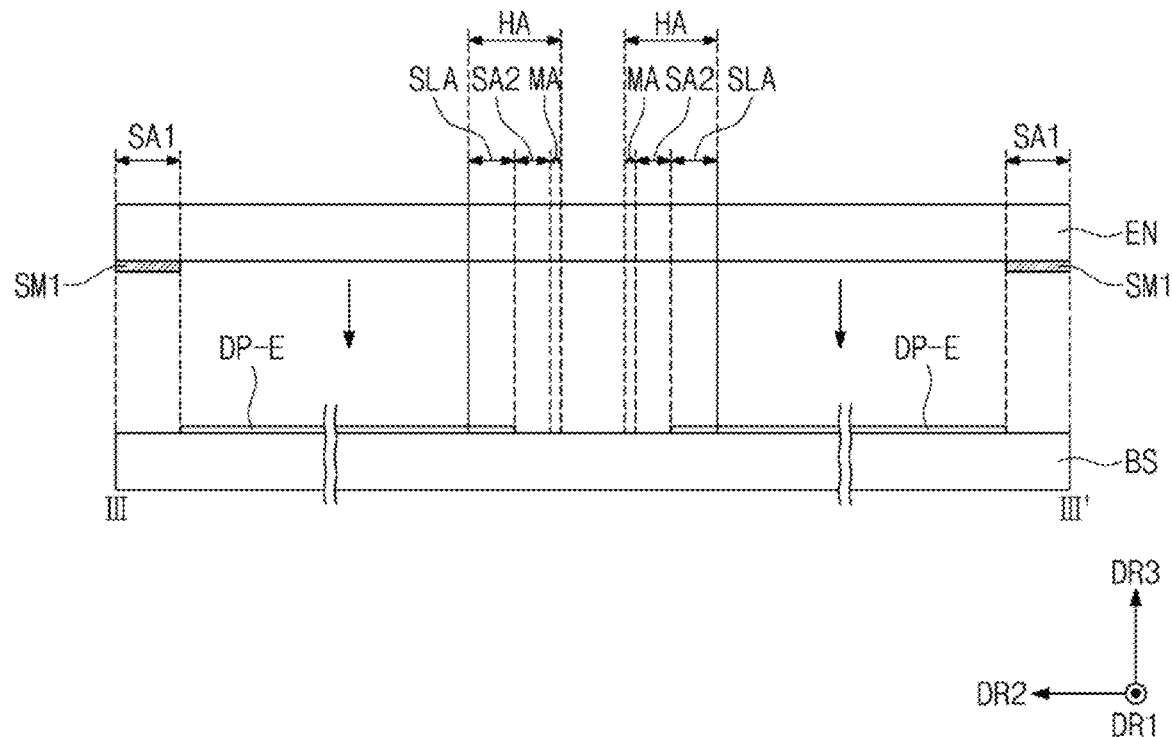
Figure 15C:
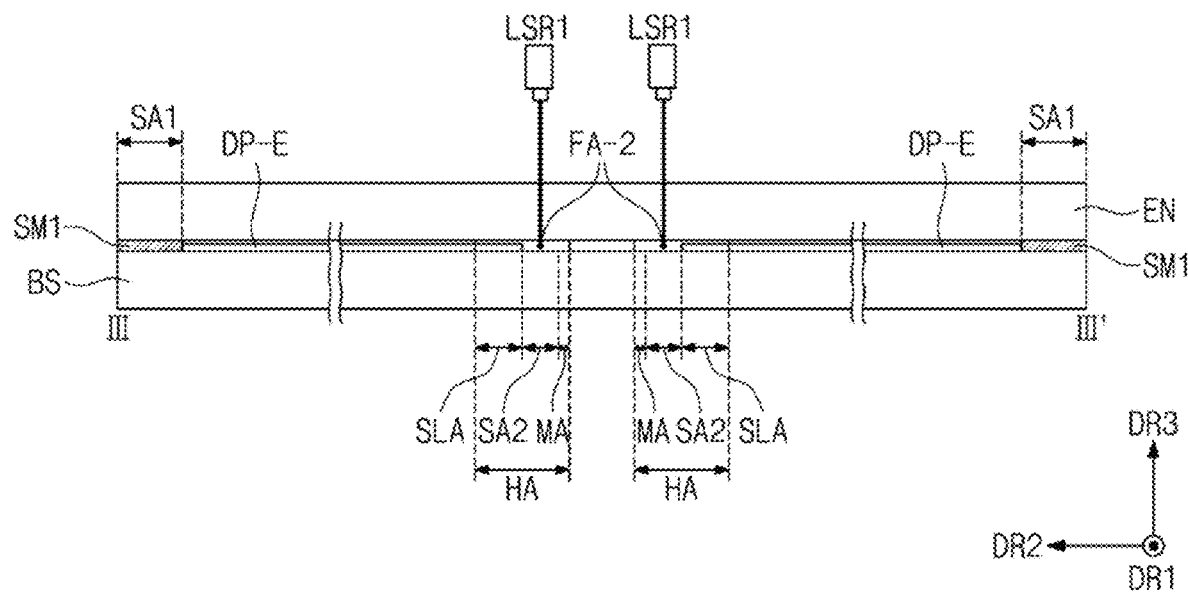
Figure 15D:
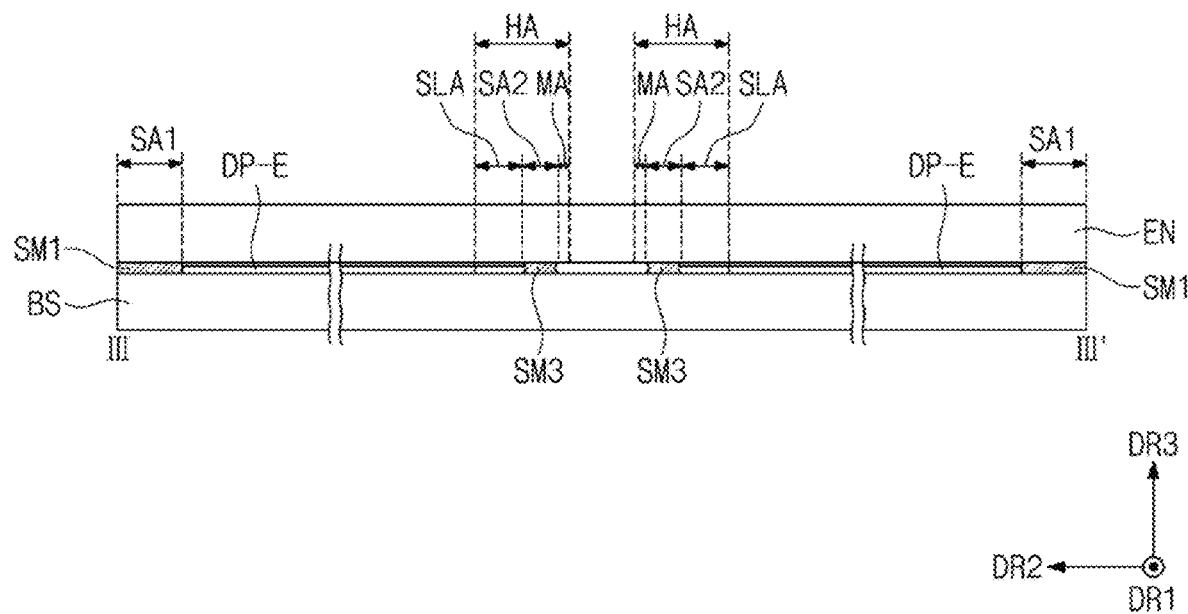

FIGS. 15A to 15D illustrate sectional views of a process of fabricating a display device according to another embodiment of the inventive concept. FIGS. 15A and 15B illustrate an embodiment in which disposing of the sealing member (S2 of FIG. 12) and providing the encapsulation substrate EN (S3 of FIG. 13) are performed in a different manner. FIGS. 15C and 15D illustrate an embodiment in which bonding of the display substrate and the encapsulation substrate (S4 of FIG. 12) is performed in a different manner. The fabrication process may be performed in the same manner as in previous embodiments, except for the operation(s) illustrated in FIGS. 15A to 15D. Thus, a detailed description of some operations (e.g., S1 and S5) previously described with reference to FIG. 12 will be omitted.

According to another embodiment of the inventive concept, the substrate-sealing member SM1 may only be disposed on the substrate-sealing region SA1 of the encapsulation substrate EN, when the sealing member is disposed (S2 of FIG. 12), but the hole-sealing member SM2 may not be disposed on the hole-sealing region SA2, as in FIGS. 15A to 15D.

In this case, a portion of each of the base substrate BS and the encapsulation substrate EN may be melted in the hole-sealing region SA2 irradiated with the first laser LSR1. Melting these portions may allow a separation space to be filled between the base substrate BS and the encapsulation substrate EN. A material SM3 filling the separation space on the hole-sealing region SA2 may bond the base substrate BS and the encapsulation substrate EN.

In the present embodiment, the sealing member SM2 may not be disposed in only the hole-sealing region SA2. In one embodiment, the sealing member SM1 may not be disposed in the substrate-sealing region SA1.

In the present embodiment, by using first laser LSR1 (e.g., an ultra-high-frequency pulsed laser), it may be possible to bond the display substrate and the encapsulation substrate EN without an additional sealing member (e.g., SM2). Thus, in the present embodiment, the thickness of the display device (e.g., DD of FIG. 1) may be reduced.

According to an embodiment of the inventive concept, it may be possible to improve durability and aesthetic appearance of a display device. In detail, according to an embodiment of the inventive concept, a bonding strength between a display substrate and an encapsulation substrate may be increased, and a width of a dead space may be reduced. Furthermore, according to an embodiment of the inventive concept, it may be possible to reduce a fabrication cost of a display device and to simplify a process of fabricating a display device.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a display device, comprising:
   providing a display substrate with a plurality of pixels;
   mounting an encapsulation substrate on the display substrate;
   bonding the display substrate and the encapsulation substrate to form a display panel; and
   forming a module hole in the display panel, wherein the module hole is adjacent to a hole region in a display area of the display substrate and wherein bonding the display substrate and the encapsulation substrate includes irradiating the hole region with an ultra-high-frequency pulsed laser to form a bond between the display substrate and the encapsulation substrate in the hole region as the ultra-high-frequency pulsed laser is irradiated onto the hole region, and
   wherein when the ultra-high-frequency pulsed laser is irradiated onto the hole region, the display substrate and the encapsulation substrate are melted and mixed in a boundary between the display substrate and the encapsulation substrate to form a bonding region in the hole region.

2. The method of claim 1, wherein the ultra-high-frequency pulsed laser is a femtosecond laser.

3. The method of claim 1, wherein irradiating the hole region with the ultra-high-frequency pulsed laser includes continuously moving a focal point of the ultra-high-frequency pulsed laser in an interface region between the display substrate and the encapsulation substrate.

4. The method of claim 1, wherein bonding the display substrate and the encapsulation substrate comprises: irradiating a laser onto a substrate-sealing region located at an edge region of each of the display substrate and the encapsulation substrate and between the display substrate and the encapsulation substrate.

5. The method of claim 4, wherein the laser irradiated onto the substrate-sealing region is a femtosecond laser.

6. The method of claim 4, further comprising:
   disposing a substrate-sealing member on the substrate-sealing region of the encapsulation substrate before mounting the encapsulation substrate on the display substrate.

7. The method of claim 1, wherein:
   a width of a hole sealing region formed in the hole region is less than or equal to about 100 µm.

8. The method of claim 1, wherein:
   the module hole passes through the display substrate and the encapsulation substrate, and
   the module hole is configured to receive an electronic module.

9. The method of claim 8, wherein the electronic module includes at least one of a camera, a speaker, a light sensing sensor, or a heat sensing sensor.

10. A method of fabricating a display device, comprising:
    providing a display substrate with a plurality of pixels;
    mounting an encapsulation substrate on the display substrate;
    bonding the display substrate and the encapsulation substrate to form a display panel; and
    forming a module hole in the display panel, wherein the module hole is adjacent to a hole region and wherein bonding the display substrate and the encapsulation substrate includes irradiating the hole region with an ultra-high-frequency pulsed laser, the display substrate and the encapsulation substrate being bonded in the hole region as the ultra-high-frequency pulsed laser is irradiated onto the hole region, wherein the hole region comprises:
    a margin region enclosing the module hole;
    a hole-sealing region enclosing the margin region,
    wherein bonding the display substrate and the encapsulation substrate includes:
    disposing a hole-sealing member on the hole-sealing region of the encapsulation substrate before mounting the encapsulation substrate on the display substrate; and
    placing a focal point of the ultra-high-frequency pulsed laser in at least one of the margin region and the hole-sealing region,
    wherein when the ultra-high-frequency pulsed laser is irradiated onto the hole-sealing region, the display substrate, the encapsulation substrate and the hole-sealing member are melted and mixed with each other to form a bonding region in the hole region.

11. The method of claim 10, wherein the hole-sealing member includes a glass material.

12. The method of claim 10, wherein:
the hole region comprises: a wiring region enclosing the hole-sealing region and including a plurality of signal lines.

13. A method of fabricating a display device, comprising:
providing a display substrate which includes a plurality of pixels;
mounting an encapsulation substrate on the display substrate;
bonding the display substrate and the encapsulation substrate to form a display panel; and
forming a module hole in the display panel, wherein the display panel includes a hole region adjacent to the module hole, a display region enclosing the hole region, and a non-display region enclosing the display region and wherein:
bonding of the display substrate and the encapsulation substrate includes irradiating a femtosecond laser in the hole region to form a bond between the display substrate and the encapsulation substrate,
wherein the display substrate and the encapsulation substrate are melted and mixed in a boundary between the display substrate and the encapsulation substrate to form a bonding region, as the femtosecond laser is irradiated.

* * * * *